(12) United States Patent
Fukuda et al.

(10) Patent No.: US 9,263,677 B2
(45) Date of Patent: *Feb. 16, 2016

(54) METHOD FOR MANUFACTURING A TRANSPARENT GAS BARRIER FILM

(71) Applicant: KONICA MINOLTA HOLDINGS, INC., Tokyo (JP)

(72) Inventors: Kazuhiro Fukuda, Hachioji (JP); Toshio Tsuji, Hachioji (JP); Chikao Mamiya, Hachioji (JP); Hiroaki Arita, Hachioji (JP)

(73) Assignee: Konica Minolta Holdings, Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/087,882

(22) Filed: Nov. 22, 2013

(65) Prior Publication Data

US 2014/0170423 A1 Jun. 19, 2014

Related U.S. Application Data

(63) Continuation of application No. 11/663,140, filed on Mar. 16, 2007, now Pat. No. 8,652,625.

(30) Foreign Application Priority Data

Sep. 21, 2004 (JP) ................................. 2004-273037
Sep. 7, 2005 (WO) .................. PCT/JP2005/016377

(51) Int. Cl.
| | | |
|---|---|---|
| H05H 1/24 | (2006.01) |
| H01L 51/00 | (2006.01) |
| B32B 7/02 | (2006.01) |
| B32B 27/00 | (2006.01) |
| C23C 16/30 | (2006.01) |
| C23C 16/34 | (2006.01) |
| C23C 16/40 | (2006.01) |
| H01L 51/52 | (2006.01) |

(52) U.S. Cl.
CPC .............. *H01L 51/0001* (2013.01); *B32B 7/02* (2013.01); *B32B 27/00* (2013.01); *C23C 16/308* (2013.01); *C23C 16/345* (2013.01); *C23C 16/401* (2013.01); *C23C 16/402* (2013.01); *H01L 51/5253* (2013.01); *H01L 51/5256* (2013.01); *H01L 2251/5346* (2013.01); *Y10T 428/24942* (2015.01); *Y10T 428/24992* (2015.01); *Y10T 428/31504* (2015.04); *Y10T 428/31663* (2015.04)

(58) Field of Classification Search
CPC ... H01L 51/0001; H01L 51/5253; H05H 1/24
USPC ........................................ 427/569, 578, 579
See application file for complete search history.

(56) References Cited

U.S. PATENT DOCUMENTS

| | | | |
|---|---|---|---|
| 5,643,638 | A | 7/1997 | Otto et al. |
| 6,114,043 | A | 9/2000 | Joret |
| 6,570,256 | B2 | 5/2003 | Conti et al. |
| 7,811,669 | B2 * | 10/2010 | Fujii et al. ...................... 428/451 |
| 8,652,625 | B2 * | 2/2014 | Fukuda et al. ................. 428/218 |
| 2004/0018361 | A1 | 1/2004 | Takahashi et al. |
| 2004/0046497 | A1 | 3/2004 | Schaepkens et al. |
| 2004/0156987 | A1 * | 8/2004 | Yim et al. ................... 427/255.6 |
| 2004/0219380 | A1 * | 11/2004 | Naruse et al. ................. 428/500 |
| 2004/0265554 | A1 * | 12/2004 | Miyadera et al. ............. 428/218 |
| 2005/0194898 | A1 | 9/2005 | Kharrazi-Olsson et al. |
| 2009/0311498 | A1 * | 12/2009 | Kiyomura et al. ............ 428/218 |
| 2014/0147684 | A1 * | 5/2014 | Kwak et al. ................... 428/447 |

FOREIGN PATENT DOCUMENTS

| | | |
|---|---|---|
| DE | 102 58 678 | 7/2004 |
| EP | 0 718 418 | 6/1996 |
| JP | 6-179962 * | 6/1994 |
| JP | 07-178860 | 7/1995 |
| JP | 7-304127 A | 11/1995 |
| JP | 11-309804 A | 11/1999 |
| JP | 2000-211053 A | 8/2000 |
| JP | 2003-055771 | 2/2003 |
| JP | 2003-201570 | 7/2003 |
| JP | 2003-276111 | 9/2003 |
| JP | 2004-192822 | 7/2004 |
| JP | 2004-202906 | 7/2004 |
| JP | 2004-322489 | 11/2004 |
| JP | 2005-53128 A | 3/2005 |

(Continued)

OTHER PUBLICATIONS

Movchan, M., et al., "Composition, structure and properties of gradient thermal barrier coatings (TBCs) produced by electron beam physical vapor deposition (EB-PVD)". Materials and Design 19 (1998) 253-258.*
Kwak, Soonjong, et al., "Gas Barrier Film with a Compositional Gradient Interface Prepared by Plasma Modification of an Organic/Inorganic Hybrid Sol-Gel Coat". Langmuir, 2009, 25 (14), 8051-8055.*
Hoferek, L., et al., "Multilayer and functionally gradient films of plasma polymers intended as compatible interlayers for hybrid materials". Surface and Coatings Technology 254 (2014) 49-53.*
Abbas, G.A., et al., "Structural investigation and gas barrier performance of diamond-like carbon based films on polymer substrates". Carbon 43 (2005) 303-309.*

(Continued)

*Primary Examiner* — Bret Chen
(74) *Attorney, Agent, or Firm* — Cozen O'Connor

(57) ABSTRACT

A method for manufacturing a transparent gas barrier film for an organic electroluminescence element having a substrate with a gas barrier layer thereon. The gas barrier layer is formed on the substrate by plasma CVD using an organic silicon compound as a raw material gas and an oxygen gas as a decomposition gas. Formation of the gas barrier layer is carried out so that a carbon content of the gas barrier layer in the thickness direction repeatedly changes more than two times from high value, via intermediate value, low value and intermediate value, to high value.

9 Claims, 6 Drawing Sheets

(56) References Cited

FOREIGN PATENT DOCUMENTS

| JP | 2005-74731 A | 3/2005 |
|---|---|---|
| JP | 2005088431 A | 4/2005 |
| JP | 2005-537963 | 12/2005 |
| JP | 8-142252 A | 6/2008 |

OTHER PUBLICATIONS

Creatore, Mariadriana, et al., "RF plasma deposition of SiO2-like films: plasma phase diagnostics and gas barrier film properties optimisation". Surface and Coatings Technology 142-144 (2001) 163-168.*

Office Action (and an English Translation thereof) dated Mar. 26, 2012 issued in the corresponding Japanese Patent Application No. 2011-22397.

Office Action (and an English Translation thereof) dated Nov. 27, 2012 issued in the corresponding Japanese Patent Application No. 2012-193389.

Explanation of Circumstances Concerning Accelerated Examination (and an English Translation thereof) dated Oct. 2, 2012 issued in the corresponding Japanese Patent Application No. 2012-193389.

Office Action (and an English Translation thereof) dated Nov. 27, 2012 issued in the corresponding Japanese Patent Application No. 2012-193390.

Explanation of Circumstances Concerning Accelerated Examination (and an English Translation thereof) dated Oct. 2, 2012 issued in the corresponding Japanese Patent Application No. 2012-193390.

Erlat et al. "SiOx Gas Barrier Coatings on Polymer Substrates: Morphology and Gas Transport Consideration", J. Phys. Chem. B (1999), 103, pp. 6047-6055.

Lin et al. "Moisture-Resistant Properties of SiNx films prepared by PECVD", Thin Solid Films, 333, (1998), pp. 71-76.

Deng et al. "Nucleation and Growth of Gas Barrier Aluminum Oixde on Surfaces of Poly (ethylene terephthalate) and Polypropylene: Effects of the Polymer Surface Properties", Journal of Polymer Science: Part B: Polymer Physics, vol. 38, pp. 3151-3162 (2000).

Iwamori et al. "Characterization of silicon ox nitride gas barrier films", Vacuum 68 (2003), pp. 113-117.

Afanasyev-Charkin et al. "Dependence of optical properties and hardness on carbon content in silicon carbonitride films deposited by plasma ion immersion processing technique", Nuclear Instruments and Methods in Physics Research B 206 (2002), 736-740.

* cited by examiner

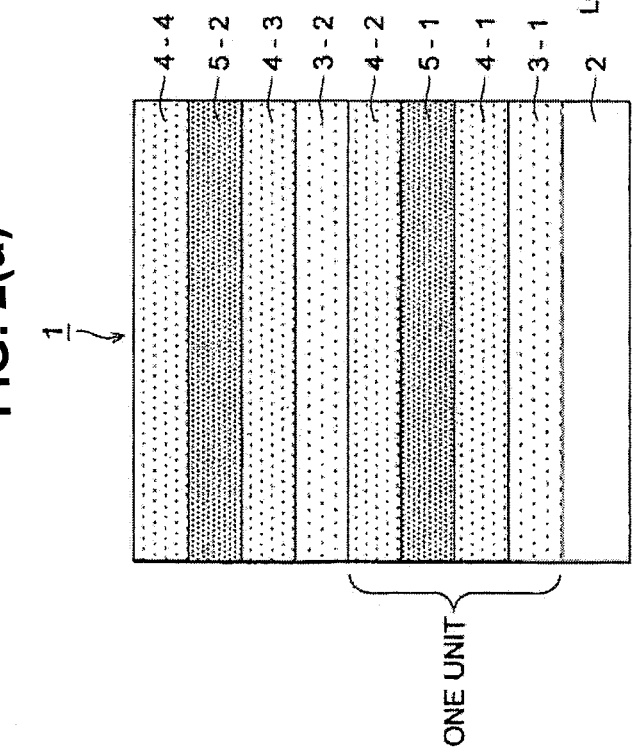
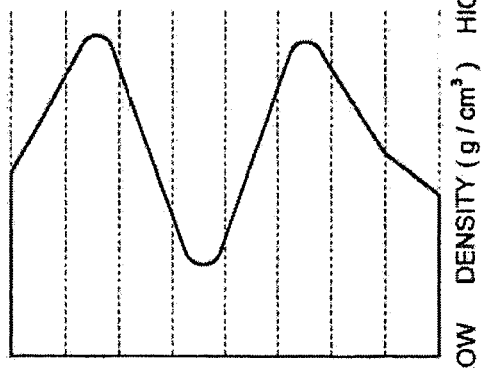
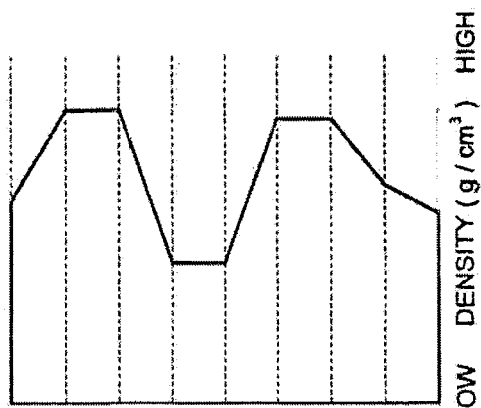

METHOD FOR MANUFACTURING A TRANSPARENT GAS BARRIER FILM

RELATED APPLICATIONS

This a continuation of U.S. Ser. No. 11/663,140, filed on Mar. 16, 2007, now U.S. Pat. No. 8,652,625, which is a U.S. National Phase under 35 U.S.C. §371 of International Application No. PCT/JP2005/016377, filed on Sep. 7, 2005.

TECHNICAL FIELD

The present invention relates to a transparent gas barrier film mainly used in packaging material for food and medicinal products and as packaging for electronic devices, or used in display material as plastic substrates for organic electroluminescence elements and liquid crystals and the like.

BACKGROUND OF THE INVENTION

Gas barrier films in which a thin layer of a metal oxide such as aluminum oxide, magnesium oxide, or silicon oxide is formed on a plastic substrate or on a film surface, have been widely used in packaging of products which require a barrier for various types of gases such as water vapor and oxygen as well as in packaging to prevent changes in the quality of foods, industrial products, medicinal products and the like. Aside from the use for packaging, gas barrier films are also used as substrates for liquid crystal displays, solar cells, organic electroluminescence (EL) and the like.

An aluminum foil is widely used as the packaging material in these kinds of fields, but disposal after use is problematic and in addition, these are basically opaque materials and the fact that the content cannot be checked from the outside is also problematic. In addition, transparency is required for display materials, and these opaque materials cannot be used.

Meanwhile, a polyvinylidene chloride resin or copolymer resin materials of vinylidene chloride and another polymer or a material which is provided with gas barrier properties by coating these vinylidene chloride resins on polypropylene resins, polyester resins or polyamide resins are widely used as packaging materials in particular, but at the incineration step, chlorine based gases are generated and this is currently problematic in view of environment preservation. Furthermore, the gas barrier properties are not necessarily sufficient and so they cannot be used in fields where high barrier properties are required.

In particular, in transparent substrates which are used more and more in liquid crystal display elements and organic EL elements in particular, in addition to the requirement in recent years to be light weight and large in size, there are also high level requirements of long term reliability and a high degree of freedom with regards to configuration. In addition, film substrates such as transparent plastic are now being used instead of glass substrates which easily break, and are heavy and difficult in increasing screen size. For example, Japanese Patent Publication Open to Public Inspection (hereafter referred to as JP-A) Nos. 2-251429 and 6-124785 disclose an example in which a polymer film is used as the substrate for an organic electroluminescence element.

However, there has been a problem in that the gas barrier property of a film substrate such as a transparent plastic film is inferior to that of a glass substrate. For example, when such a substrate having an insufficient gas barrier property is used as a substrate of the organic electroluminescence element, water vapor and air may penetrate the substrate to degrade the organic layer, resulting in loss of light emitting properties or durability. In addition, when a polymer substrate is used as an electronic device substrate, oxygen may pass through the polymer substrate, penetrate and diffuse into the electronic device causing problems such as deterioration of the device or making it impossible to maintain the required degree of vacuum in the electronic device.

In order to solve this type of problem, a gas barrier film substrate in which a thin metal oxide layer is formed on a film substrate is known. Layers in which silicon oxide (Patent Document 1) or aluminum oxide (Patent Document 2) is deposited on the plastic film are also known as the gas barrier used in packaging material or liquid crystal element. In either case, currently the layers have water vapor barrier properties that do not exceed about 2 $g/m^2/day$ or oxygen transmission that does not exceed about 2 $ml/m^2/day$. In recent years, due to the EL displays which require greater gas barrier properties, increasing size of liquid crystal displays and development of high definition displays, water vapor barrier of around $10^{-3}$ $g/m^2/day$ is required for the gas barrier properties of the film substrate.

A gas barrier film having a structure in which a compact ceramic layer and flexible polymer layer which softens impact from outside are alternately laminated a number of times, is proposed as a method for meeting these requirements of high water vapor barrier properties (see Patent Document 3 for example). However, because the composition of the ceramic layer and the polymer layer is generally different, adhesion at the respective adhesion interfaces deteriorate and cause product deterioration such as layer stripping. In particular, the occurrence of adhesion deterioration is outstanding under severe conditions such as high temperature and high humidity or exposure to ultraviolet radiation for an extended period, and thus early improvement is desired.

Patent Document 1 Examined Japanese Patent Publication No. 53-12953

Patent Document 2 Japanese Patent Publication Open to Public Inspection (hereafter referred to as JP-A) No. 58-217344

Patent Document 3 U.S. Pat. No. 6,268,695

SUMMARY OF THE INVENTION

The present invention was conceived in view of the above-described problems and an object thereof is to provide a transparent gas barrier film which has excellent adhesion even when stored under severe conditions, and has favorable transparency and gas barrier resistance.

One of the aspects of the present invention to achieve the above object is a transparent gas barrier film comprising a substrate having thereon a gas barrier layer comprising at least a low density layer and a high density layer, wherein one or more intermediate density layers are sandwiched between the low density layer and the high density layer.

BRIEF DESCRIPTION OF THE DRAWINGS

FIG. 2(a) is a pattern diagram showing another example of the layer composition of a gas barrier film of the present invention and FIGS. 2(b) and 2(c) are the density profiles thereof.

DESCRIPTION OF THE PREFERRED EMBODIMENTS

Figure 1B:
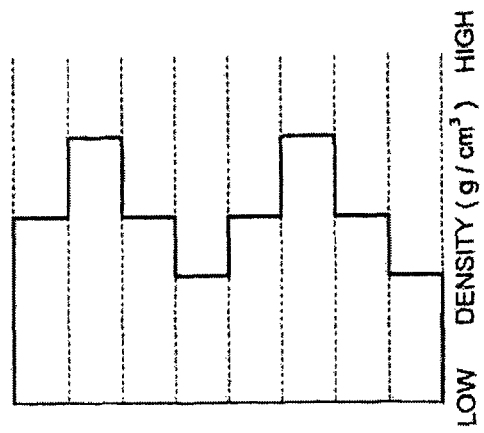
FIG. 1(a) is a pattern diagram showing an example of the layer composition of a gas barrier film of the present invention and FIG. 1(b) is the density profile thereof.

The above object of the present invention is achieved by the following structures.

(1) A transparent gas barrier film comprising a substrate having thereon a gas barrier layer comprising at least a low density layer and a high density layer, wherein
one or more intermediate density layers are sandwiched between the low density layer and the high density layer.

(2) The transparent gas barrier film of Item (1), wherein the low density layer, the intermediate density layer and the high density layer each contain a common element.

(3) The transparent gas barrier film of Item (1) or (2), wherein
the transparent gas barrier film comprises a unit comprising the low density layer, the intermediate density layer, the high density layer and the intermediate density layer laminated in that order from the substrate side; and
the unit is repeatedly laminated twice or more.

(4) The transparent gas barrier film of any one of Items (1) to (3), wherein
a density distribution in the low density layer, the intermediate density layer or the high density layer exhibits a graded structure along a thickness direction.

(5) The transparent gas barrier film of any one of Items (1) to (4), wherein
the low density layer, the intermediate density layer and the high density layer each comprise at least one compound selected from the group consisting of silicon oxide, silicon oxynitride, silicon nitride and aluminum oxide.

(6) The transparent gas barrier film of any one of Items (1) to (5), wherein
the high density layer comprises silicon oxide; and
a density of the high density layer at a maximum density region is 2.1 g/cm$^3$ or more.

(7) The transparent gas barrier film of any one of Items (1) to (6), wherein the low density layer comprises silicon oxide; and
a density of the low density layer at a minimum density region is 2.0 g/cm$^3$ or less.

(8) The transparent gas barrier film of any one of Items (1) to (5), wherein
the high density layer comprises silicon oxynitride; and
a density of the high density layer at a maximum density region is 2.2 g/cm$^3$ or more.

(9) The transparent gas barrier film of any one of Items (1) to (6), wherein
the low density layer comprises silicon oxynitride; and
a density of the low density layer at a minimum density region is 2.0 g/cm$^3$ or less.

(10) The transparent gas barrier film of any one of Items (1) to (5), wherein
the high density layer comprises silicon nitride; and
a density of the high density layer at a maximum density region is 2.2 g/cm$^3$ or more.

(11) The transparent gas barrier film of any one of Items (1) to (6), wherein
the low density layer comprises silicon nitride; and
a density of the low density layer at a minimum density region is 2.0 g/cm$^3$ or less.

(12) The transparent gas barrier film of any one of Items (1) to (5), wherein
the high density layer comprises aluminum oxide; and
a density of the high density layer at a maximum density region is 3.5 g/cm$^3$ or more.

(13) The transparent gas barrier film of any one of Items (1) to (6), wherein
the low density layer comprises aluminum oxide; and
a density of the low density layer at a minimum density region is 3.0 g/cm$^3$ or less.

The following is a detailed description of the preferred embodiment for realizing the present invention.

As a result of diligent studies in view of the problems described above, the inventors of the present invention found out that a transparent gas barrier film with excellent adhesion even when stored under severe conditions, favorable transparency and gas barrier resistance is realized by a transparent gas barrier film comprising a gas barrier layer that is formed on a substrate from at least a low density layer and a high density layer, wherein one or more intermediate density layers are between the low density layer and the high density layer.

Furthermore, in addition to the structure specified above, it was discovered that the target effects of the present invention were expressed even more when: the low density layer, the intermediate density layer and the high density layer include the same elements; given that from the substrate side, a low density layer, an intermediate density layer a high density layer, and an intermediate density layer form one unit and this unit is laminated twice or more; including a graded structure in which the density distribution in the low density layer, the intermediate density layer or the high density layer changes continuously in the thickness direction; the low density layer, the intermediate density layer and the high density layer includes at least one substance selected from silicon oxide, silicon nitride oxide, silicon nitride and aluminum oxide; using silicon oxide, silicon oxynitride, silicon nitride or aluminum oxide in the high density layer or the low density layer and using the maximum density or the minimum density of that layers as prescribed conditions.

The transparent gas barrier film according to Items (1)-(13) of the present invention can obtain the same effects by employing the preferable aspects described in the following.

(A) A transparent gas barrier film comprising a substrate having thereon a gas barrier layer containing at least a high carbon content layer and a low carbon content layer, wherein one or more intermediate carbon content layers are sandwiched between the low carbon content layer and the high carbon content layer.

(B) The transparent gas barrier film of Item (A), wherein the low carbon content layer, the intermediate carbon content layer and the high carbon content layer include the same elements.

(C) The transparent gas barrier film of Item (A) or (B), wherein given that from the substrate side, the high carbon content layer, the intermediate carbon content layer, the low carbon content layer, and the intermediate carbon content layer form one unit, lamination of this unit is repeated twice or more.

(D) The transparent gas barrier film of any one of Items (A)-(C), wherein the carbon content distribution in the low carbon content layer, the intermediate carbon content layer or the high carbon content layer has a content gradient in the thickness direction.

(E) The transparent gas barrier film of Item (D), wherein the compound forming the carbon content gradient is silicon oxide and the minimum carbon content is no more than 1.0%

(F) The transparent gas barrier film of Item (D), wherein the compound forming the carbon content gradient is silicon oxide and the maximum carbon content is no less than 20.0%

(G) The transparent gas barrier film of Item (D), wherein the compound forming the carbon content gradient is silicon nitride and the minimum carbon content is no more than 1.0%

(H) The transparent gas barrier film of Item (D), wherein the compound forming the carbon content gradient is silicon nitride and the maximum carbon content is no less than 20.0%.

(I) The transparent gas barrier film of Item (D), wherein the compound forming the carbon content gradient is aluminum oxide and the minimum carbon content is no more than 1.0%

(J) The transparent gas barrier film of Item (D), wherein the compound forming the carbon content gradient is aluminum oxide and the maximum carbon content is no less than 20.0%.

The following is a detailed description of the present invention.

The transparent gas barrier film of the present invention contains a gas barrier layer that is formed on a substrate from at least a low density layer and a high density layer, wherein one or more layers of an intermediate density layer are sandwiched between the low density layer and the high density layer.

Given that average density of low density layer with the lowest average density is $d_1$ and the average density of high density layer with the highest average density is $d_2$, the intermediate density layer in the present invention is defined as the layer with the average density $d_3$ which satisfies the condition of Equation (1).

$$(d_1+3d_2)/4 \geq d_3 \geq (3d_1+d_2)/4 \qquad \text{Equation (1)}$$

The density of each of the component layers stipulated in the present invention can be determined using the known analytic means, but in the present invention values determined by the X-ray reflectance method are used.

An outline of the X-ray reflectance method in X-ray diffraction Handbook, Page 151 (edited by Rigaku Denki Corporation 2000, Published by International Academic Printing Co., Ltd) or Chemical Industries, January 1999 No. 22 can be referred to perform the method.

The following is a specific example of the method for measurement useful in the present invention.

MXP21 manufactured by Mac Science Co., Ltd. is used as the measuring device. The device is operated at 42 kV and 500 mA using copper as the X-ray light source. A multilayer parabola mirror is used as the incident monochrometor. An incidence slit of 0.05 mm×5 mm and a light receiving slit of 0.03 mm×20 mm is used. Measurements are done using the FT method having $2\theta/\theta$ mode from 0 degree to 5 degrees with step size of 0.005 degrees and scanning speed of 10 seconds per step. Curve fitting is performed using the Reflectivity Analysis Program Vector. 1 manufactured by Mac Science Co., Ltd. for the obtained by the reflectance curve, and the parameters are determined such that the residual sum of squares of the measured value and the fitting curve is a minimum. The thickness and density of the laminated layer can be obtained from the parameters. The layer thickness evaluation of the laminated layer in the present invention can also be determined by the X-ray reflectance measurements described above.

In the transparent gas barrier film of the present invention given that from the substrate side, a low density layer, an intermediate density layer, a high density layer, and an intermediate density layer, are laminated in that order to form one unit, the unit is preferably laminated twice or more, or in other words eight layers or more are laminated, and more preferably, the number of laminated units is 2-4.

In addition, in transparent gas barrier film of the present invention, the density distribution in the low density layer, the intermediate density layer or the high density layer preferably has a graded structure in the thickness direction.

Figure 1A:
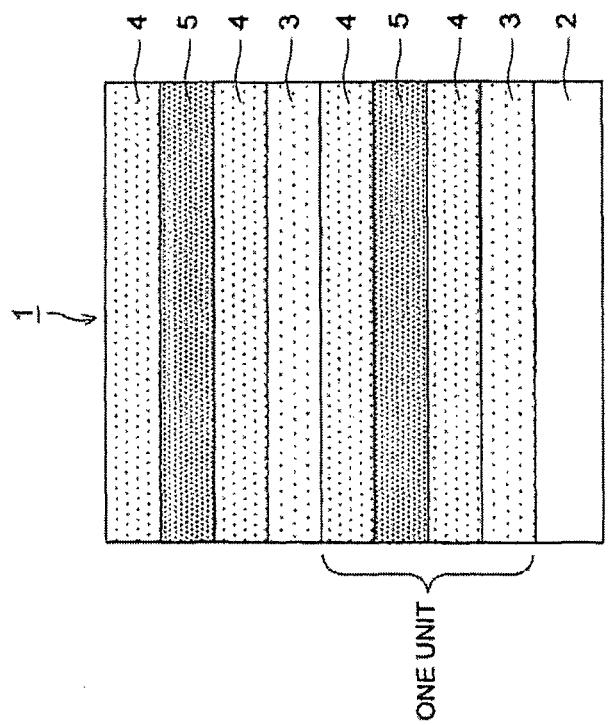

FIG. 1(a) is a pattern diagram showing an example of the layer constitution of a gas barrier film of the present invention and FIG. 1(b) is the density profile thereof.

The transparent gas barrier film 1 of the present invention has a structure in which layers of different densities are laminated on the substrate 2. In the present invention, the intermediate density layer 4 of the present invention is provided between the low density layer 3 and the high density layer 5, and an intermediate density layer 4 is provided on the high density layer, and if the structure comprising the low density layer, intermediate density layer, high density layer, and intermediate density layer form one unit, FIG. 1 shows and example in which 2 units are laminated. In this case, the density distribution inside the each density layer is even, and the density changes between adjacent layers are step-wise. It is to be noted that in FIG. 1, the intermediate density layer 4 is shown as one layer, but a structure having two layers or more may be employed if necessary.

FIG. 2(a) is a pattern diagram showing another example of the layer constitution of a gas barrier film of the present invention and FIGS. 2(b) and 2(c) are the density profile thereof.

The layer constitution is a two unit constitution which is the same as that shown in 1 above, but the density distribution in the low density layer, intermediate density layer, or high density layer has a graded structure in the thickness direction.

In the density distribution profile shown in FIG. 2, the density distribution in the low density layer 3-1 which is in contact with the substrate 2 has a continuous density change pattern in which the density of the surface contacting the substrate has the minimum value and has an gradation (+gradation) in which density increases in the thickness direction, and the intermediate density layer 4-1 which is laminated on the low density layer 3-1 also has the +gradation. In this case, the intermediate density layer 4-1 employs a structure with two or more layers.

Next, in FIG. 2(b), the density pattern in the layer of the high density layer 5-1 laminated on the intermediate density layer 4-1 is an example of the convex density distribution which shows the maximum value of the density inside the layer. Also, in FIG. 2(c), an example is shown which has even density distribution in the layers, as is the case in the high density layer 5 of FIG. 1. Next, the intermediate density layer 4-2 on the high density layer 5-1 is formed such that the density decreases in the thickness direction (−gradation) to exhibit a continuous density change pattern. The low density layer 3-2 is further laminated on the intermediate density layer 4-2, but the density distribution pattern of the low density layer 3-2 in this case may be the convex density distribution example which shows the minimum value of density in the layers, or may be the example which has even density distribution in the layers as is the case in the low density layer 3 shown in FIG. 1.

In the transparent gas barrier film of the present invention, as shown in FIGS. 1 and 2, the method for controlling the density difference between the layers to the desired conditions is not particularly limited, however, in the layer formation using the atmospheric plasma method described hereinafter that is favorably applied in the present invention, a proper density can be obtained by suitably selecting a method, namely, the fixed electrodes group is inclined with respect to the rotatable roll electrode to change the space between the electrodes; or the type and supply amount of supplied layer forming material or the output condition of electric power at the time of plasma discharge is suitably selected.

In addition, as shown in FIG. 2, in the case where density changes are performed continuously in the layers also, it is preferable that the atmospheric plasma method is used, and a proper density can be obtained by continuously controlling the supply amount of the layer formation material at the time of forming the layer, or the output conditions at the time of plasma discharge.

In addition, in the case where density between the layers is continuously changed as is shown in FIG. 2(b), in the present invention, the interface between the layers is defined as the region in which the slope of the density distribution pattern changes.

The transparent gas barrier film of the present invention is formed from layers of different densities including the low density layer, intermediate density layer, high density layer, but a preferable aspect of the transparent gas barrier film is one including a gas barrier layer formed on a substrate of at least a low carbon content layer and a high carbon content layer, wherein one or more medium carbon content layers are sandwiched between the low carbon content layer and the high carbon content layer.

Given that average carbon content of the high carbon content layer with the highest carbon content is $n_1$ and average carbon content of the low carbon content layer with the lowest carbon content is $n_2$, the medium carbon content layer of the present invention, is defined as the layer with the average carbon content $n_3$ which satisfies the conditions stipulated by Equation (2).

$$(n_1+3n_2)/4 \leq n_3 \leq (3n_1+n_2)/4 \quad \text{Equation (2)}$$

The carbon content of each of the component layers stipulated in the present invention can be obtained using the known analytic means.

The atomic concentration which indicates the carbon content ratio in the present invention is calculate by the XPS method described below, and is defined by the following.

Atomic concentration=Number of carbon atoms/Total number of atoms×100.

In the present invention, the ESCALAB-200R manufactured by VG Scientific is used as the XPS surface analyzer. More specifically, Mg is used in the X-ray anode and measured at output 600 W (acceleration pressure 15 kV, Emission current 40 mA). The energy resolution is set to be 1.5 eV-1.7 eV when half breadth of pure Ag 3d5/2 peaks is measured.

The measurement is done by first measuring the bond energy 0 eV-1100 eV range at data fetching intervals of 1.0 ev and determining whether all the elements have been detected.

Next, all the elements except the etching ions are narrow-scanned for the photoelectron peak at the maximum applied intensity with a data fetching interval of 0.2 eV and then the specter is measured for each element.

The obtained specter is transferred to Common Data Processing System (preferably after Ver. 2.3) manufactured by VAMAS-SCA-JAPAN in order to prevent difference in the content ratio calculation results from occurring due to differences in the measuring device or computer and the value for the content ratio of each element which is a target for analysis (carbon, oxygen, silicon, and titanium) is determined as atomic concentration: at %.

Before the determination process is performed, calibration of the count scale for each element is performed, and then 5 point smoothing process is performed. In the determination process, peak intensity (cps*eV) in which the background is removed is used. In the background process, the Shirley method is used. The Shirley method can be referred to in D. A. Shirley, Phys, Rev., B5, 4709 (1972).

The carbon content profile between the carbon content layers in the transparent gas barrier film of the present invention can be the same as the patterns shown in FIG. 1 and FIG. 2 mentioned above. That is to say the low density layer in FIGS. 1 and 2 corresponds to the high carbon content layer and the high density layer corresponds to the low carbon content layer and thus the density pattern and the carbon content pattern show reversal profiles.

In the gas barrier film of the present invention, the method for controlling the carbon content difference between the layers to the desired conditions is not particularly limited, but in the layer formation of the atmospheric plasma method described hereinafter that is preferably applied in the present invention, the layer is obtained by suitably selecting a method, namely, the fixed electrodes group is inclined with respect to the rotatable roll electrode to change the space between the electrodes; or the type and supply amount of supplied layer forming material or the output condition of electric power at the time of plasma discharge is suitably selected.

Next, the component elements of the transparent gas barrier film of the present invention will be described, <Gas Barrier Layer>

First, the gas barrier layer formed from the low density layer, the intermediate density layer, and the high density layer of the present invention will be described.

The constitution of the gas barrier layer of the present invention is not particularly limited provided that permeation of oxygen and water vapor is blocked. The material for forming the gas barrier layer is preferably inorganic oxides, and specific examples of the material include silicon oxide, aluminum oxide, silicon oxynitride, silicon nitride, magnesium oxide, zinc oxide, indium oxide, and tin oxide. The thickness of the gas barrier layer in the present invention varies and is suitably selected in accordance with the type of material used and optimal conditions for the constitution, but it is preferably in the range of 5-2000 nm. If the thickness of the gas barrier is less than the above range, an even layer cannot be obtained and is difficult to obtain gas barrier properties. In addition, thickness of the gas barrier is greater than the above range, it is difficult to maintain flexibility of the gas barrier film and there is the possibility that cracks and the like may occur in the gas barrier film due to external factors such as bending and pulling after layer formation.

The gas barrier layer of the present invention may be formed by subjecting the material described below to the spraying method, spin coating method, sputtering method, ion assist method, plasma CVD method described hereinafter, or the plasma CVD method under atmospheric pressure or approximately atmospheric pressure.

However, in wet methods such as the spray method and the spin coating methods, obtaining molecular level (nm level) smoothness is difficult, and because a solvent is used, and the substrate which is described hereinafter is an organic material, there is the shortcoming that materials or solvents that can be used are limited. Thus, in the present invention, a layer that is formed using the plasma CVD method or the like is preferable, and the atmospheric plasma CVD method in particular is preferable in view that a reduced pressure chamber and the like is unnecessary, high speed layer formation becomes possible, and it is a high productivity layer formation method. By forming the transparent gas barrier layer using the atmospheric plasma CVD method, it becomes possible to form a layer which is even and has surface smoothness relatively easily. The plasma CVD method is the plasma CVD method under atmospheric pressure or approximately atmospheric pressure, and it is particularly preferable that the plasma CVD method under atmospheric pressure or approximately atmospheric pressure is used. The layer formation conditions in the plasma CVD method is described in detail hereinafter.

It is preferable that the gas barrier layer is obtained by using the plasma CVD method or the plasma CVD method performed under atmospheric pressure or near atmospheric pressure because a metal carbide, metal nitride, metal oxide, metal sulfide, metal halide and their mixture thereof (such as metal oxide-nitride, metal oxide-halide, and metal nitride-carbide) can be optionally produced by selecting an organometal compound as the raw material, decomposition gas, decomposition temperature and applying electric power.

For example, silicon oxide is formed by using a silicon compound as the raw material and oxygen as the decomposition gas, and zinc sulfide is formed by using a zinc compound as the raw material and carbon disulfide as the decomposition gas. In the space of plasma, very high actively charged particles or active radicals exist in high density. Therefore, plural steps of chemical reaction are accelerated in very high rate in the plasma space and the elements being in the plasma space is converted to the chemically stable compound within extremely short duration.

The state of the inorganic raw material may be gas, liquid or solid at room temperature as far as the raw material contains a typical metal element or a transition metal element. The gas can be directly introduced into the discharging space and the liquid or solid is used after vaporized by a method such as heating bubbling or applying ultrasonic wave. The raw material may be used after diluted by a solvent. An organic solvent such as methanol, ethanol, n-hexane and a mixture thereof can be used for such the solvent. The influence of the solvent can be almost ignored because the solvent is decomposed into molecular or atomic state by the plasma discharge treatment.

Examples of such the organic compound include a silicon compound such as silane, tetramethoxysilane, tetraethoxysilane, tetra-n-propoxysilane, tetra-iso-propoxsilane, tetra-n-butoxysilane, tetra-t-butoxysilane, dimethyldimethoxysilane, dimethyldiethoxysilane, diethyldimethoxysilane, diphenylsimethoxysilane, methyltriethoxysilane, ethyltrimethoxysilane, phenyltriethoxysilane, (3,3,3-trifluoropropyl)trimethoxysilane, hexamethyldisyloxane, bis(dimethylamino)dimethylsilane, bis(dimethylamino)methylvinylsilane, bis(ethylamino)dimethylsilane, N,O-bis(trimethylsilyl)acetoamide, bis(trimethylsilyl)carbodiimide, diethylaminotrimethylsilane, dimethylaminodimethylsilane, hexamethyldisilazane, heaxamethylcyclotrisilazane, heptamethylsilazane, nonamethyltrisilazane, octamethylcyclotetrasilazane, tetrakisdimethyaminosilazane, tetraisocyanate silane, tetramethyldisilazane, tris(dimethylamino)silane, triethoxyfluorosilane, allyldimethylsilane, allyltrimethylsilane, benzyltrimethylsilane, bis(trimethylsilyl)acetylene, 1,4-bistrimethylsilyl-1,3-butadiine, di-t-butylsilane, 1,3-disilabutane, bis(trimethylsilyl)methane, cyclopentanedienyltrimethylsilane, phenyldimethylsilane, phenyltrimethylsilane, propagyltrimethylsilane, tetramethylsilane, trimethylsilylacetylene, 1-(trimethylsilyl)-1-propine, tris(trimethylsilyl)methane, tris(trimethylsilyl)silane, vinyltrimethylsilane, hexamethyldisilane, octamethylcyclotetrasiloxane, tetramethylcyclotetrasiloxane, heaxmethylcycrotetrasiloxane and M-silicate 51.

Examples of the titanium compound include titanium methoxide, titanium ethoxide, titanium isopropoxide, titanium tetraisoboroxide, titanium n-butoxide, titanium isopropoxide(bis-2,4-pentanedionate), titanium diisopropoxide (bis-2,4-ethylacetoacetate), titanium di-n-butoxide(bis-2,4-pentanedionate), titanium caetylacetonate and butyl titanate dimer.

Examples of the zirconium compound include zirconium n-propoxide, zirconium n-butoxide, zirconium t-butoxide, zirconium tri-n-butoxide acetylacetonate, zirconium di-n-butoxide bisacetylacetonate, zirconium acetylacetonate, zirconium acetate and zirconium heaxafluoropentanedionate.

Examples of the aluminum compound include aluminum ethoxide, aluminum triisopropoxise, aluminum isopropoxide, aluminum n-butoxide, aluminum s-butoxide, aluminum t-butoxide, aluminum acetylacetonate and triethyldialuminum tri-s-butoxide.

Examples of the boron compound include diborane, boron fluoride, boron chloride, boron bromide, borane-diethyl ether complex, borane-THF complex, borane-dimethyl sulfide complex, borane trifluoride-diethyl ether complex, triethylborane, trimethoxyborane, triethoxyborane, tri(isopropoxy)borane, borazole, trimethylborazole, triethylborazole and triisopropylborazole.

Examples of the tin compound include teraethyltin, tetramethyltin, diaceto-di-n-butyltin, terabutyltin, tetraoctyltin, tetraethoxytin, methyltriethoxytin, diethyldiethoxytin, triisopropylethoxytin, diethyltin, dimethyltin, diisopropyltin, dibutyltin, diethoxytin, dimethoxtin, diisopropoxytin, dibutoxytin, tin dibutylate, tin acetoacetonate, ethyltin acetoacetonate, ethoxytin acetoacetonate, dimethyltin acetoacetonate, tin hydride and tin halide such as tin dichloride and tin tetrachloride.

Examples of another organic metal compound include antimony ethoxide, arsenic triethoxide, barium 2,2,6,6-tetramethylheptanedionate, beryllium acetylacetonate, bismuth hexafluoropnetanedionate, dimethylcadmium, calcium 2,2,6,6-tetramethylheptanedionate, chromium trifluoropentanedionate, cobalt cetylacetonate, copper hexafluoropentanedionate, magnesium heaxfluoropentane-dionate-dimethyl ether complex, gallium ethoxide, tetraethoxygermanium, hafnium t-butoxide, hafnium ethoxide, indium acetylacetonate, indium 2,6-dimethylaminoheptanedionate, ferrocene, lanthanum isopropoxide, lead acetate, tetraethyllead, neodium acetylacetonate, platinum hexafluoropentanedionate, trimethylcyclopentanedienylplatinum, rhodium dicarbonylacetylacetonate, strontium 2,2,6,6-tetramethylheptanedionate, tantalum methoxide, tantalum triflfuoroethoxide, tellurium ethoxide, tungsten ethoxide, vanadium triisopropoxideoxide, magnesium hexafluorocetylacetonate, zinc acetylacetonate and diethylzinc.

Examples of the decomposition gas for decomposing the raw material gas containing the metal to form an inorganic compound include hydrogen gas, methane gas, acetylene gas, carbon monoxide gas, carbon dioxide gas, nitrogen gas, ammonium gas, nitrogen suboxide gas, nitrogen oxide gas, nitrogen dioxide gas, oxygen gas, steam, fluorine gas, hydrogen fluoride, trifluoroalcohol, trifluorotoluene, hydrogen sulfide, sulfur dioxide, carbon disulfide and chlorine gas.

Various kinds of metal carbide, metal nitride, metal oxide, metal halide and metal sulfide can be obtained by suitably selecting the metal element-containing raw material gas and the decomposition gas.

Such the reactive gas is mixed with a discharging gas capable of easily becoming into a plasma state and sent into the plasma discharge generation apparatus. Nitrogen gas and/or an atom of Group 18 of periodic table such as helium, neon, argon, krypton, xenon and radon are used for such the discharging gas. Of these, nitrogen, helium and argon are preferably used.

The discharging gas and the reactive gas are mixed to prepare a mixed gas and supplied into the plasma discharge (plasma generating) apparatus to form the layer. The reactive gas is supplied in a ratio of the discharging gas to whole mixture of the gases of 50% or more although the ratio is varied depending on the properties of the layer to be formed.

In the gas barrier layer of the present invention, the organic compound included in the gas barrier is preferably $SiO_x$, $SiN_y$, or $SiO_xN_y$ ($x=1$-$2$, $y=0.1$-$1$), and $SiO_x$ is preferable in view of the transmission of water content, the transmission of light rays, and the suitability of atmospheric plasma CVD.

The inorganic compound of the present invention may be combined with the above organic silicon compound as well as oxygen gas or nitrogen gas in a prescribed proportion, and a layer including at least one of O atoms and the N atoms and Si atoms can be obtained. It is to be noted that an N atom is preferably included in view of the fact that $SiO_2$ has high transmission and the gas barrier properties are slightly reduced and some water passes through. That is to say, given that the ratio of the number of oxygen atoms to that of nitrogen atoms is $x$:$y$, $x/(x+y)$ is preferably 0.95 or less, and more preferably 0.80 or less. Thus, in the gas barrier layer of the present invention, the light ray transmission T is preferably 80% or more.

It is to be noted that if the proportion of N atoms is large, transparency decreases, and in SiN where $x=0$, there is some amount of yellowing. Thus the specific proportion of the oxygen atoms and the nitrogen atoms should be determined in accordance with application. For example, for applications which require transparency such as when the layer is formed on a light emitting surface side with respect to the light emitting element in the display device, $x/(x+y)$ is 0.4 or more and 0.95 is preferable as there is balance between transparency and water repellency. In addition, for application in which it is preferable that light is absorbed or blocked as for antireflection layers provided on the back surface of the light emitting element of the display device, $x/(x+y)$ is preferably not less than 0 and less than 0.4.

Thus, the gas barrier layer of the present invention is preferably transparent. When the gas barrier layer is transparent, it becomes possible for the gas barrier film to be transparent, and it can be used in applications such as the transparent substrate for organic EL elements.

<Substrate>

The substrate used in the transparent gas barrier film of the present invention is not particularly limited provided it is a layer that is formed of an organic material that can hold the gas barrier layer that has the barrier properties.

Specific examples of the films which may be used are as follows. Homopolymers such as ethylene, polypropylene, butene, or copolymers or polyolefin (PO) resins such as copolymers; amorphous polyolefin resins (APO) such as cyclic polyolefins; polyester resins such as polyethylene terephthalate (PET) and polyethylene 2,6-naphthalate (PEN); polyamide (PA) resins such as nylon 6, nylon 12 and copolymer nylon; polyvinyl alcohol resins such as polyvinyl alcohol (PVA) resins and ethylenevinyl alcohol copolymers (EVOH); polyimide (PI) resins; polyether imide (PEI) resins; polysulfone (PS) resins; polyether sulfone (PES) resins; polyether ether ketone (PEEK) resins; polycarbonate (PC) resins; polyvinyl butyrate (PVB) resins; polyarylate (PAR) resins; fluorine resins such as ethylene-tetrafluoroethylene copolymers (ETFE), ethylene trifluorochloride (PFA), ethylene tetrafluoride-perfluoroalkyl vinyl ether copolymers (FEP), vinylidene fluoride (PVDF), vinyl fluoride (PVF), and perfluoroethylene-perfluoropropylene-perfluorovinyl ether copolymers (EPA). Also, besides the above resins, photocurable resins such as resin compositions comprising an acrylate compound having a radical reactive unsaturated compound, resin compositions including the acrylate compound and a mercapto compound having a thiol group and resin compositions obtained by dissolving oligomers such as epoxyacrylate, urethaneacrylate, polyesteracrylate, or polyether acrylate in a polyfunctional acrylate monomer or mixtures of these resins may be used. Furthermore, laminates obtained by laminating one or two or more of these resins by means of laminating or coating may be used as the substrate film.

These materials may be used singly or may be suitably mixed. Of these, commercially available products such as Zeonex or Zeonor (manufactured by Nippon Zeon), ARTON which is an amorphous cyclopolyolefein resin film (manufactured by JSR), Pureace which is polycarbonate film (manufactured by Teijin), Konica tack KC4UX and KC8UX which are cellulose triacetate films (manufactured by Konica Minolta) may be suitably used.

The substrate is preferably transparent. When the substrate and the layer formed on the substrate is also transparent, it becomes possible for the gas barrier film to be transparent, and thus it can be used for transparent substrates such as organic EL elements.

The substrate of the present invention using the resin listed above may be either an unstretched film or a stretched film.

The substrate according to the present invention may be produced using a conventionally known usual method. For example, a resin as the raw material is melted using an extruder, extruded using a cyclic die or T-die and cooled quickly, and thus an unstretched substrate which is substantially amorphous and non-oriented can be produced. Also, an unstretched substrate is stretched in the direction of the flow (vertical axis) of the substrate or in the direction perpendicular (horizontal axis) to the direction of the flow of the substrate by using a known method such as uniaxial orientation, tenter-type sequential biaxial stretching, tenter-type simultaneous biaxial stretching, or tubular-type simultaneous biaxial stretching, and thus a stretched substrate can be produced. The magnification of stretching in this case is preferably 2 to 10 in both of the vertical axis direction and the horizontal axis direction, buy it may be suitably selected to correspond with a resin as the raw material of the substrate.

Also, the substrate according to the present invention may be processed by surface treatment such as corona treatment, flame treatment, plasma treatment, glow discharge treatment, surface roughing treatment, or chemical treatment.

Furthermore, an anchor coating-agent layer may be formed on the surface of the substrate according to the present invention with the purpose of improving adhesion to the vacuum deposition layer. Examples of anchor coating agent to be used in the anchor coating-agent layer include a polyester resin, isocyanate resin, urethane resin, acryl resin, ethylenevinyl alcohol resin, denatured vinyl resin, epoxy resin, denatured styrene resin, denatured silicon resin, and alkyl titanate, and these may be used either singly or in combinations of two or more. Conventionally known additives may be added to the anchor coating agents. The substrate may be coated with the above anchor coating agent by using a known method such as roll coating, gravure coating, knife coating, dip coating, or spray coating and the solvents or diluents are removed by drying, and thus anchor coating can be carried out. The amount of the above anchor coating agent to be applied is preferably about 0.1 to 5 g/m$^2$ (dry condition).

A long product which is wound to be roll-like is convenient as the substrate cannot be generally specified because it differs depending on uses of the obtained gas barrier film, and the thickness of the substrate is not particularly limited when the gas barrier film is used for packaging. However, based on suitability for packaging material, it is preferably in the range of 3 to 400 μm, and more preferably 6 to 30 μm.

In the addition, the substrate used in the present invention is preferably a layer having a thickness of 10 to 200 μm and more preferably 50 to 100 μm.

Also, the water vapor transmission rate for the gas barrier film of the present invention is preferably 1.0 g/m$^2$/day or less when measured by the JIS K7129 B method, when used for applications which require a high degree of water vapor barrier properties such as organic EL displays and high resolution color liquid crystal displays. Furthermore, in the case where the gas barrier film is used for organic EL displays, even if almost negligible, dark spot which grow are generated, and the life of the display is sometimes is shortened to a great extent and thus the water vapor transmission rate of the gas barrier film is preferably 0.1 g/m$^2$/day.

<<Plasma CVD Method>>

Next, the plasma CVD method and the plasma CVD method under atmospheric pressure, which can be preferably employed to form the low density layer, the intermediate density layer and the high density layer of the present invention in the production method of the transparent gas barrier film of the present invention will be explained further in detail.

The plasma CVD method of the present invention will now be explained.

The plasma CVD method is also called as plasma enhanced chemical vapor deposition method or PECVD method, by which a layer of various inorganic substances having high covering and contact ability can be formed on any solid-shaped body without excessively raising the temperature of the substrate.

The usual CVD method (chemical vapor deposition method) is a method in which the evaporated or sublimated organic metal compound is stuck onto the surface of the substrate at high temperature and thermally decomposed to form a thin layer of a thermally stable inorganic substance. Such usual CVD method (also referred to as a thermal CVD method) cannot be applied for layer forming on the plastic substrate since the substrate temperature is not less than 500° C.

In the plasma CVD method, a space in which gas is in the plasma state (a plasma space) is generated by applying voltage in the space near the substrate. Evaporated or sublimated organometal compound is introduced into the plasma space and decomposed, followed by being blown onto the substrate to form a thin layer of inorganic substance. In the plasma space, the gas of a high ratio of several percent is ionized into ions and electrons, and the electron temperature is very high while the gas is held at low temperature. Accordingly, the organometal compound which is the raw material of the inorganic layer can be decomposed by contacting with the high temperature electrons and the low temperature but excited state of ion radicals. Therefore, the temperature of the substrate on which the inorganic layer is formed can be kept low, and thus the layer can be sufficiently formed even on a plastic substrate.

However, since it is necessary to apply an electric field to the gas for ionizing the gas into the plasma state, the film has usually been produced in a space reduced in the pressure of from about 0.101 kPa to 10.1 kPa. Accordingly the plasma CVD equipment has been large and the operation has been complex, resulting in suffering from a problem of productivity.

In the plasma CVD method under near atmospheric pressure, not only the reduced pressure is not necessary, resulting in a high productivity, but also a high layer forming rate is obtained since the density of the plasma is higher. Further a notably flat film compared to that obtained via usual plasma CVD method is obtained, since mean free path of the gas is considerably short under the high pressure condition namely an atmospheric pressure. Thus obtained flat film is preferable with respect to the optical property or the gas barrier property. As described above, in the present invention, the plasma CVD method under near atmospheric pressure is more preferable than the plasma CVD method under vacuum.

The apparatus for forming the polymer layer or the gas barrier layer by the plasma CVD method under the atmospheric pressure or near atmospheric pressure is described in detail below.

An example of the plasma layer forming apparatus to be used in the gas barrier material producing method of the present invention for forming the low density layer, the intermediate density layer and the high density layer is described referring FIGS. 3 to 6. In the drawings, F is a long length film as an example of the substrate.

Figure 3:
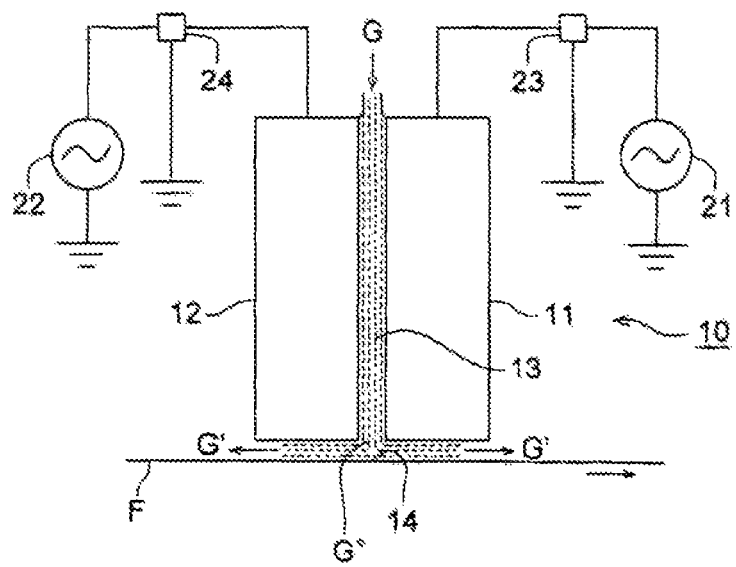
FIG. 3 is a schematic view showing an example of the jet type atmospheric plasma discharge treatment device useful in the present invention.

FIG. 3 is a schematic drawing of an example of an atmospheric pressure plasma discharge apparatus by jet system available for the present invention.

The jet system atmospheric pressure discharge apparatus is an apparatus having a gas supplying means and an electrode temperature controlling means, which are not described in FIG. 3 (shown in FIG. 4 later), additionally to a plasma discharge apparatus and an electric field applying means with two electric power sources.

A plasma discharge apparatus 10 has facing electrodes constituted by a first electrode 11 and a second electrode 12. Between the facing electrodes, first high frequency electric field with frequency of $\omega_1$, electric field strength of $V_1$ and electric current of $I_1$ supplied by the first power source 21 is applied by the first electrode 11 and second high frequency electric field with frequency of $\omega_2$, electric field strength of $V_2$ and electric current of $I_2$ supplied by the second power source 32 is applied by the second electrode 12. The first power source 21 can supply high frequency electric field strength higher than that by the second power source 22 ($V_1 > V_2$) and the first power source 21 can supply frequency $\omega_1$ lower than the frequency $\omega_2$ supplied by the second power source 22.

A first filter 23 is provided between the first electrode 11 and the first power source 12 so that the electric current from the first power source 21 is easily passed to the first electrode 11 and the current from the second power source 22 is difficulty passed to the first electrode 11 by grounding the current from the second power source 22 to the first power source 21.

A second filter 24 is provided between the first electrode 12 and the first power source 22 so that the electric current from the second power source 22 is easily passed to the second electrode and the current from the first power source 21 is difficulty passed to the second electrode by grounding the current from the first power source 21 to the second power source.

Figure 4:
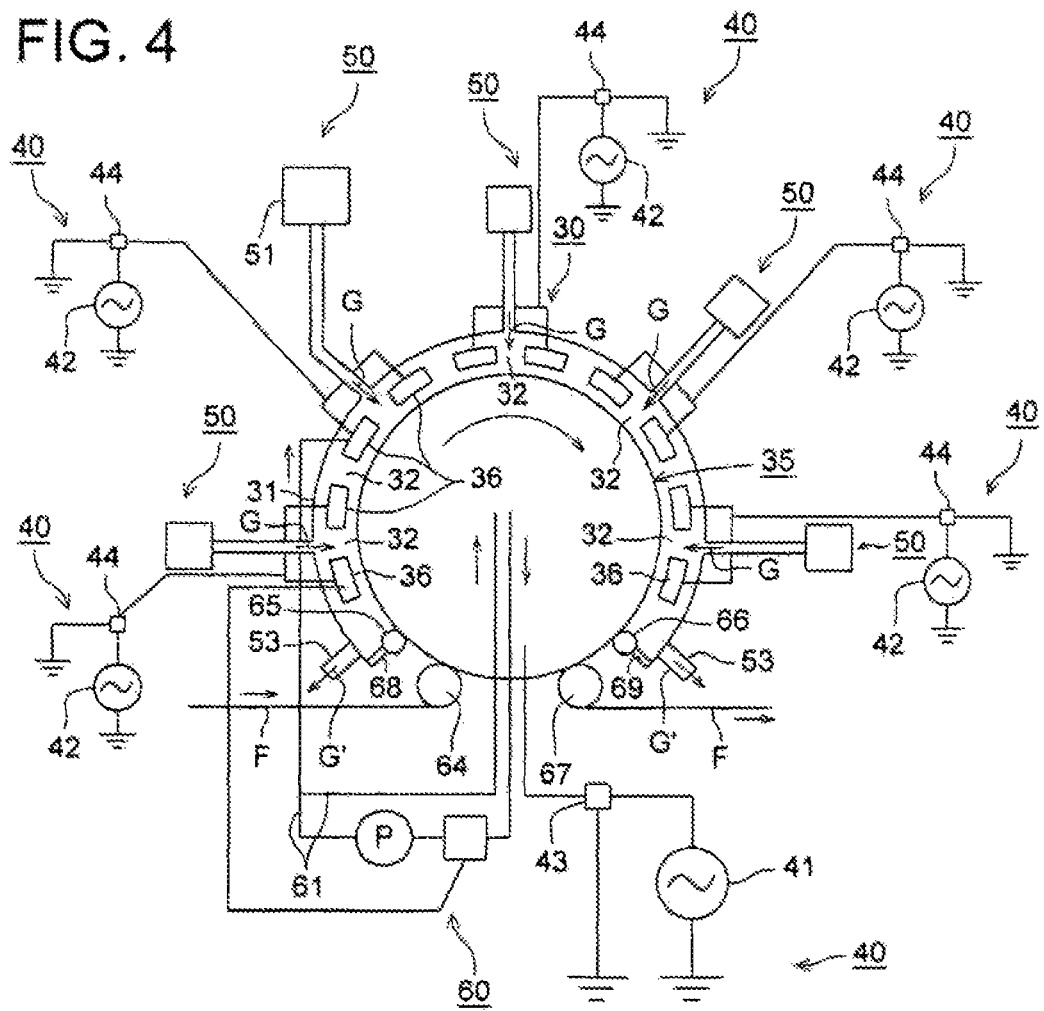
FIG. 4 is a schematic view showing an example of the type of atmospheric plasma discharge treatment device which processes substrate between facing electrodes that is useful in the present invention.

Gas G is introduced from a gas supplying means such as that shown in FIG. 4 into the space 13 (discharging space) between the facing first electrode 11 and the second electrode 12, and discharge G° is generated by applying high frequency electric field from the first and second electrodes so as to make the gas to plasma state and the gas in the plasma state is jetted G' to the under side (under side of the paper in the drawing) of the facing electrodes so as to fill the treatment space constituted by under surfaces of the facing electrodes and the substrate F by the gas in the plasma state, and then the thin layer is formed near the treatment position 14 on the substrate F conveyed from the bulk roll (unwinder) of the substrate by unwinding or from the previous process. During the layer formation, the electrodes are heated or cooled by a medium supplied from the electrode temperature controlling means shown in FIG. 4 which will be mentioned later trough the pipe. It is preferable to suitably control the temperature of the electrodes because the physical properties and the composition are varied sometimes according to the temperature of the substrate on the occasion of the plasma discharge treatment. As the medium for temperature control, an insulation material such as distilled water and oil is preferably used. It is desired that the temperature at the interior of the electrode is uniformly controlled so that ununiformity of temperature in the width direction and length direction of the substrate is made as small as possible on the occasion of the plasma discharge treatment.

A plurality of the atmospheric pressure plasma discharge treating apparatus by the jetting system can be directly arranged in series for discharging the same gas in plasma state at the same time. Therefore, the treatment can be carried out plural times at high rate. Furthermore, a multilayer composed of different layers can be formed at once by jetting different gases in plasma state at the different apparatuses, respectively.

FIG. 4 is a schematic drawing of an example of the atmospheric pressure discharge apparatus for treating the substrate between the facing electrodes effectively applied for the present invention.

The atmospheric pressure plasma discharge apparatus of the present invention at least has a plasma discharge apparatus 30, an electric field applying means having two electric power sources 40, a gas supplying means 50 and an electrode temperature controlling means 60.

In the apparatus shown in FIG. 4, a thin layer is formed by the plasma discharge treatment carried out on the substrate F in a charge space 32 constituted between a rotatable roller electrode (first electrode) 35 and a group of square pillar-shaped electrodes (second electrode) 36. In FIG. 4, an electric field is formed by a pair of square pillar-shaped electrodes (second electrode) 36 and a rotatable roller electrode (first electrode) 35, and using this unit, for example, a low density layer is formed. FIG. 4 illustrates an example including five such units, and, by independently controlling, for example, the supplying raw material and output voltage in each unit, the laminating type transparent gas barrier layer as prescribed in the present invention can be continuously formed.

In each discharging space 32 (between the facing electrodes) formed between the rotatable roller electrode (first electrode) 35 and the square pillar-shaped fixed electrode group (second electrode) 36, the first high frequency electric field with frequency $\omega_1$, electric field strength $V_1$ and electric current $I_1$ supplied from a first power source 41 is applied to the rotatable roller electrode (first electrode) 35, and a second high frequency electric field with frequency $\omega_2$, electric field strength $V_2$ and electric current $I_2$ supplied from the corresponding second power source 42 is applied to each square pillar-shaped fixed electrode group (second electrode) 36, respectively.

A first filter 43 is provided between the rotatable roller electrode (first electrode) 35 and the first power source 41 and the first filter 43 is designed so that the electric current from the first power source 41 to the first electrode is easily passed and the electric current from the second power source 42 to the first electrode is difficulty passed by grounding. Furthermore, a second filter 44 is provided between the square pillar-shaped fixed electrode (second electrode) 36 and the second power source 42 and the second filter 44 is designed so that the electric current from the second power source 42 to the second electrode is easily passed and the electric current from the first power source 41 to the second electrode is difficultly passed by grounding.

In the present invention, it is allowed to use the rotatable roller electrode 35 as the second electrode and the square pillar-shaped fixed electrode 35 as the first electrode. In all cases, the first power source is connected to the first electrode and the second power source is connected to the second electrode. The first electrode preferably supplies high frequency electric field strength larger than that of the second power source ($V_1 > V_2$). The frequency can be $\omega_1 < \omega_2$.

The electric current is preferably $I_1 < I_2$. The electric current $I_1$ of the first high frequency electric field is preferably from 0.3 mA/cm$^2$ to 20 mA/cm$^2$ and more preferably from 1.0 mA/cm$^2$ to 20 mA/cm$^2$. The electric current $I_2$ of the second high frequency electric field is preferably from 10 mA/cm$^2$ to 100 mA/cm$^2$ and more preferably from 20 mA/cm$^2$ to 100 mA/cm$^2$.

Gas G generated by a gas generating apparatus 51 of the gas generating means 50 is controlled in the flowing amount and introduced into a plasma discharge treatment vessel 31 through a gas supplying opening.

The substrate F is unwound from a bulk roll not shown in the drawing or conveyed from a previous process and introduced into the apparatus trough a guide roller 64. Air accompanied with the substrate is blocked by a nipping roller 65. The substrate F is conveyed into the space between the square pillar-shaped fixed electrode group and the rotatable roller electrode (first electrode) 35 while contacting and putting round with the rotatable roller electrode. Then the electric field is applied by both of the rotatable roller electrode (first electrode) and the square pillar-shaped fixed electrode group (second electrode) 36 for generating discharging plasma in the space 32 (discharging space) between the facing electrodes. A thin layer is formed by the gas in the plasma state on the substrate while contacting and putting round with the rotatable roller electrode 35. After that, the substrate F is wound up by a winder not shown in the drawing or transported to a next process through a nipping roller 66 and a guide roller 67.

The exhaust gas G' after the treatment is discharged from an exhaust opening 53.

For cooling or heating the rotatable roller electrode (first electrode) 35 and the square pillar-shaped fixed electrode group (second electrode) 36 during the thin layer formation, a medium controlled in the temperature by an electrode temperature controlling means 60 is sent to the both electrodes by a liquid sending pump P through piping 61 to control the temperature of the electrodes from the interior thereof. 68 and 69 are partition plates for separating the plasma discharging treatment vessel 31 from the outside.

Figure 5:
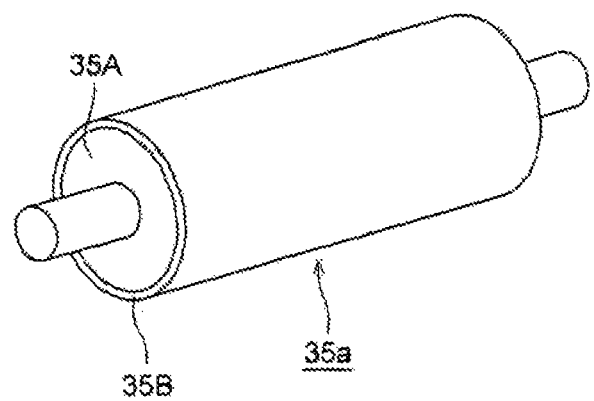
FIG. 5 is a perspective view showing an example of the conductive base metal for the rotatable roll electrodes and the dielectric structure that covers the base metal.

FIG. 5 shows an oblique view of the structure of an example of the rotatable roller electrode shown in FIG. 4 composed of an electroconductive metal base material and a dielectric material covering the base material.

In FIG. 5, the roller electrode 35a is composed of an electroconductive metal base 35A covered with a dielectric material 35B. The electrode is constituted so that the temperature controlling medium such as water and silicone oil can be circulated in the electrode for controlling the surface temperature of the electrode during the plasma discharging treatment.

Figure 6:
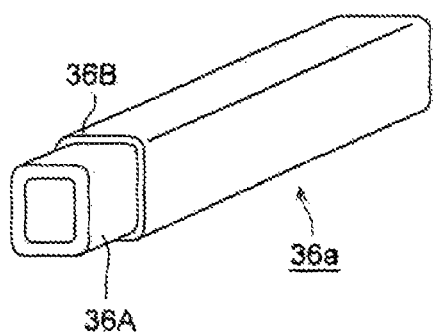
FIG. 6 is a perspective view showing an example of the conductive base metal for the square pillar-shaped electrodes and the dielectric structure coated thereon.

FIG. 6 shows an oblique view of the structure of an example of the rotatable roller electrode composed of an electroconductive metal base material and a dielectric material covering the core material.

In FIG. 6, a square pillar-shaped electrode 36a is composed of an electroconductive metal base 36A having a cover of dielectric material 36B as same as shown in FIG. 5 and the electrode constitutes a metal pipe forming a jacket so that the temperature can be controlled during the discharging.

The plural square pillar-shaped fixed electrodes are arranged along the circumstance larger than that of the roller electrode and the discharging area of the electrode is expressed by the sum of the area of the surface of the square pillar-shaped electrodes facing to the rotatable roller electrode 35.

The square pillar-shaped electrode 36a may be a cylindrical electrode but the square pillar-shaped electrode is preferably used in the present invention since the square pillar-shaped electrode is effective for increasing the discharging extent (discharging area) compared with the cylindrical electrode.

The roller electrode 35a and the square pillar-shaped electrode 36a shown in FIGS. 5 and 6 are each prepared by thermal spraying ceramics as the dielectric material 35B or 36B on the metal base 35A or 35B and subjecting to a sealing treatment using a an inorganic sealing material. The thickness of the ceramics dielectric material may be about 1 mm. As the ceramics material for the thermal spraying, alumina and silicon nitride are preferably used, among them alumina, which can be easily processed, is particularly preferred. The dielectric layer may be a lining treated dielectrics formed by lining an inorganic material.

For the electroconductive metal base material 35A and 36B, a metal such as metal titanium and a titanium alloy, silver, platinum, stainless steel, aluminum and iron, a composite material of iron and ceramics and a composite material of aluminum and ceramics are usable and the metallic titanium and titanium alloy are particularly preferable by the later-mentioned reason.

The distance between the facing first and second electrodes is the shortest distance between the surface of the dielectric layer and the surface of the electroconductive metal base material of the other electrode when the dielectric layer is provided on one of the electrodes, and is the shortest distance between the dielectric layer surfaces when the dielectric material is provided on both of the electrodes. Though the distance between the electrodes is decided considering the thickness of the dielectric material provided on the electroconductive metal base material, the strength of the applied electric field and the utilizing object of the plasma, the thickness is preferably from 0.1 to 20 mm and particularly preferably from 0.5 to 2 mm in any cases from the viewpoint for performing uniform discharge.

Details of the electroconductive metal base material and the dielectric useful in the present invention material will be described later.

Though the plasma discharging treatment vessel 31 is preferably a glass vessel such as Pyrex® glass, a metal vessel can be used when the vessel can be insulated from the electrodes. For example, one constituted by a frame of aluminum or stainless steel covered on inside thereof by polyimide resin or one constituted by such the thermal sprayed with ceramics for giving insulating ability are usable. The both side surfaces in parallel of the both electrodes (near the core material surface) is preferably covered with the above-described material.

Examples of the first power source (high frequency power source) employed in the atmospheric pressure plasma processing apparatus of the present invention include the following power sources:

| Reference Number | Maker | Frequency | Product name |
|---|---|---|---|
| A1 | Shinko Denki | 3 kHz | SPG3-4500 |
| A2 | Shinko Denki | 5 kHz | SPG5-4500 |
| A3 | Kasuga Denki | 15 kHz | AGI-023 |
| A4 | Shinko Denki | 50 kHz | SPG50-4500 |
| A5 | Heiden Kenkyusho | 100 kHz* | PHF-6k |
| A6 | Pearl Kogyo | 200 kHz | CF-2000-200k |
| A7 | Pearl Kogyo | 400 kHz | CF-2000-400k |

Any of the above commercially available power sources can be used in the present invention.

Examples of the second power source (high frequency power source include the following power sources:

| Reference Number | Maker | Frequency | Trade name |
|---|---|---|---|
| B1 | Pearl Kogyo | 800 kHz | CF-2000-800k |
| B2 | Pearl Kogyo | 2 MHz | CF-2000-2M |
| B3 | Pearl Kogyo | 13.56 MHz | CF-2000-13M |
| B4 | Pearl Kogyo | 27 MHz | CF-2000-27M |
| B5 | Pearl Kogyo | 150 MHz | CF-2000-150M |

Any of the above commercially available power sources can be used in the present invention.

In the power sources above, "*" represents an impulse high frequency power supply (100 kHz in continuous mode) manufactured by Heiden Kenkyusho, and others are high frequency power supplies capable of applying electric field with only continuous sine wave.

In the present invention, it is preferable that the power source which enables to keep a uniform and stable discharge state with supplying such an electric field is employed in the atmospheric pressure plasma discharge apparatus.

In the present invention, when power is supplied across the facing electrodes, power (power density) of not less than 1 W/cm$^2$ is supplied to the second electrode (the second high frequency electric field) so as to excite the discharge gas to generate plasma. The energy is then given to the reactive gas, whereby a thin film is formed and give the resulting energy to the discharge gas. The upper limit of the power supplied to the second electrode is preferably 50 W/cm$^2$, and more preferably 20 W/cm². The lower limit of the power supplied is preferably 1.2 W/cm². The discharge surface area (cm²) refers to the surface area of the electrode at which discharge occurs.

Further, the power density can be enhanced while the uniformity of the second high frequency electric field is maintained, by supplying power (power density) of not less than 1 W/cm² to the first electrode (the first high frequency electric field), whereby more uniform plasma with higher density can be produced, resulting in improving both film forming rate and film quality. The power supplied to the first electrode is preferably not less than 5 W/cm². The upper limit of the power supplied to the first electrode is preferably 50 W/cm².

Herein, the waveform of the high frequency electric field is not specifically limited. There are a continuous oscillation mode which is called a continuous mode with a continuous sine wave and a discontinuous oscillation mode which is called a pulse mode carrying out ON/OFF discontinuously, and either may be used, however, a method supplying a continuous sine wave at least to the second electrode side (the second high frequency electric field) is preferred to obtain a uniform film with high quality.

The quality of the film can also be controlled by controlling the electric power of the second electrode.

It is necessary that electrodes used in the atmospheric pressure plasma film forming method is structurally and functionally resistant to the use under severe conditions. Such electrodes are preferably those in which a dielectric is coated on a metal base material.

In the dielectric coated electrode used in the present invention, the dielectric and metal base material used in the present invention are preferably those in which their properties meet. For example, one embodiment of the dielectric coated electrodes is a combination of conductive metal base material and a dielectric in which the difference in linear thermal expansion coefficient between the conductive base material and the dielectric is not more than $10 \times 10^{-6}/°$ C. The difference in linear thermal expansion coefficient between the conductive metal base material and the dielectric is preferably not more than $8 \times 10^{-6}/°$ C., more preferably not more than $5 \times 10^{-6}/°$ C., and most preferably not more than $2 \times 10^{-6}/°$ C. Herein, the linear thermal expansion coefficient is a known physical value specific to materials.

Combinations of conductive base material and dielectric having a difference in linear thermal expansion coefficient between them falling within the range as described above will be listed below.

1. A combination of pure titanium or titanium alloy as conductive metal base material and a thermal spray ceramic layer as a dielectric layer 2: A combination of pure titanium or titanium alloy as conductive metal base material and a glass lining layer as a dielectric layer 3: A combination of stainless steel as conductive metal base material and a thermal spray ceramic layer as a dielectric layer 4: A combination of stainless steel as conductive metal base material and a glass lining layer as a dielectric layer 5: A combination of a composite of ceramic and iron as conductive metal base material and a thermal spray ceramic layer as a dielectric layer 6: A combination of a composite of ceramic and iron as conductive metal base material and a glass lining layer as a dielectric layer 7: A combination of a composite of ceramic and aluminum as conductive metal base material and a thermal spray ceramic layer as a dielectric layer 8: A combination of a composite of ceramic and aluminum as conductive metal base material and a glass lining layer as a dielectric layer.

In the viewpoint of the difference in the linear thermal expansion coefficient, preferable are above 1, 2, and 5-8, but specifically preferable is 1.

In the present invention, as a metal base metal material, titanium is useful with respect to the above-mentioned property. By using titanium or a titanium alloy as the metal base material and by using the above dielectric, the electrode can be used under a severe condition for a long time without deterioration of the electrode, specifically, a crack, peeling or elimination.

As an atmospheric pressure plasma discharge apparatus employable in the present invention, for example, those disclosed in JP-A Nos. 2004-68143 and 2003-49272 and WO02/48428 are included, together with described above.

EXAMPLES

The following is a detailed description of the present invention using examples, however, the present invention is not limited thereto.

Example 1

Production of the Transparent Gas Barrier Film 1

A transparent gas barrier film in which three units each comprising a low density layer, an intermediate density layer, a high density layer, and an intermediate density layer with the profile constitution (layer density distribution pattern) shown in FIG. 1 are formed on a polyethylene naphthalate film with a thickness of 100 μm (manufactured by Teijin Dupont and called PEN hereinafter) using the atmospheric plasma discharge treatment device and discharge conditions below.

(Atmospheric Plasma Discharge Treatment Device)

A set of a roll electrode coated by a dielectric substance and a plurality of square pillar-shaped electrodes are produced as shown below using the atmospheric plasma discharge treatment device of FIG. 4.

In the roll electrode, or the first electrode, a jacket roll base metal material made of titanium alloy T64 having a cooling device using cooling water is coated with an alumina spray layer with high density and high adhesion according to an atmospheric plasma method such that the roll diameter is 1000 mm. Meanwhile, in the second electrode, or a square pillar-shaped electrode, the square hollow cylinder made of titanium T64 is coated in thickness of 1 mm under the same condition as for the above dielectric to produce a square pillar-shaped fixed electrode group facing each other.

Twenty-four of these square cylinder are disposed around the rotatable roll electrode with an facing electrode interval of 1 mm. The total discharge area of the group of square pillar-shaped fixed electrodes is 14,400 cm² which is obtained by 150 cm (width direction length)×4 cm (conveying direction length)×24 electrodes. It is noted that each has a suitable filter.

During plasma discharge, the temperature adjustment and insulation is done such that the first electrode (rotatable roll electrode) and second electrode (square pillar-shaped fixed electrode group) are 80° C., and rotatable roll electrode is rotated by a drive and layer formation is performed. Of the twenty-four square pillar-shaped fixed electrodes, four from the upstream side are used for forming the first layer described below (low density layer 1), the next six are used for forming the second layer described below (intermediate density layer 1) and the next eight are used for forming the third layer (high density layer 1), and the remaining six are used to form the fourth layer (intermediate density layer 2), and the conditions are set so that the four layers are laminated in one pass. These conditions are repeated twice to form the transparent gas barrier film 1.

(First Layer: Low Density Layer 1)

Plasma discharge was carried out under the conditions below to form a low density layer 1 having a thickness of approximately 90 nm.

<Gas Conditions>

| | |
|---|---|
| Discharge gas: Nitrogen gas | 94.8 volume % |
| Raw material gas: Hexamethyldisiloxane (abbreviated to HMDSO hereinafter) (Nitrogen gas is mixed and vaporized by a vaporizer manufactured by Lintec Commerce Inc.) | 0.2 volume % |
| Decomposition gas: Oxygen gas | 5.0 volume % |

<Power Condition: Only the Power Source at the First Electrode Side is Used>

First Electrode Side

Type of power source: High frequency power source manufactured by Applied Electronics Corporation Frequency: 80 kHz Output density: 10 W/cm$^2$ The density of the first layer (low density layer) formed above was measured by the X-ray reflectance method using aforementioned MXP21 manufactured by Mac Science Co., Ltd. and a result of 1.90 was obtained.

(Second Layer: Intermediate Density Layer 1)

Plasma discharge was carried out under the conditions below to form an intermediate density layer 1 having a thickness of approximately 90 nm.

<Gas Conditions>

| | |
|---|---|
| Discharge gas: Nitrogen gas | 94.9 volume % |
| Raw material gas: Hexamethyldisiloxane (abbreviated to HMDSO hereinafter) (Nitrogen gas is mixed and vaporized by a vaporizer manufactured by Lintec Commerce Inc.) | 0.1 volume % |
| Decomposition gas: Oxygen gas | 5.0 volume % |

<Power Conditions: Only the Power Source for the First Electrode Side is Used>

First Electrode Side

Type of power source: High frequency power source manufactured by OYO Electronic Co., Ltd.

Frequency: 80 kHz

Output density: 10 W/cm$^2$

The density of the second layer (intermediate density layer) formed above was measured by the X-ray reflectance method using aforementioned MXP21 manufactured by Mac Science Co., Ltd. and a result of 2.05 was obtained.

(Third Layer: High Density Layer 1)

Plasma discharge was carried out under the conditions below to form a high density layer 1 having a thickness of approximately 90 nm.

<Gas Conditions>

| | |
|---|---|
| Discharge gas: Nitrogen gas | 94.9 volume % |
| Raw material gas: Hexamethyldisiloxane (abbreviated to HMDSO hereinafter) (Nitrogen gas is mixed and vaporized by a vaporizer manufactured by Lintec Commerce Inc.) | 0.1 volume % |
| Decomposition gas: Oxygen gas | 5.0 volume % |

<Power Conditions>

First Electrode Side

Type of power source: High frequency power source manufactured by Applied Electronics Corporation Frequency: 80 kHz Output density: 10 W/cm$^2$ Second Electrode Side Type of power source: High frequency power source manufactured by Pearl Kogyo Co., Ltd.

Frequency: 13.56 MHz

Output density: 10 W/cm$^2$

The density of the third layer (high density layer) formed above was measured by the X-ray reflectance method using aforementioned MXP21 manufactured by Mac Science Co., Ltd. and a result of 2.20 was obtained.

(Fourth Layer: Intermediate Density Layer 2)

The intermediate density layer 2 is formed under the same conditions as the second layer (intermediate density layer 1).

(Fifth Layer to Twelfth Layer)

The same conditions for the formation of the first layer to the fourth layer (one unit) are repeated twice to form the transparent gas barrier film 1.

<Evaluation of the Transparent Gas Barrier Film>

[Measurement of Density Distribution]

Figure 7A:
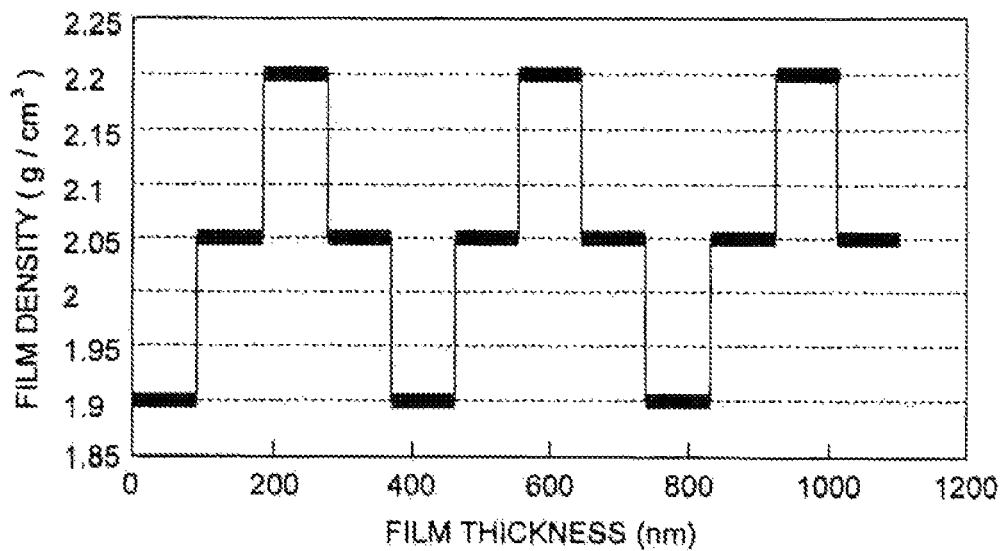
FIGS. 7a and 7b are illustrative graphs showing the results of the density profile measured by the X-ray reflectance method and the carbon content profile measured by the XPS surface analysis method.

The results of the density profile measured by the X-ray reflectance method using the MXP21 manufactured by Mac Science Co., Ltd. are shown in FIG. 7a.

[Measurement of Carbon Content]

Figure 7B:
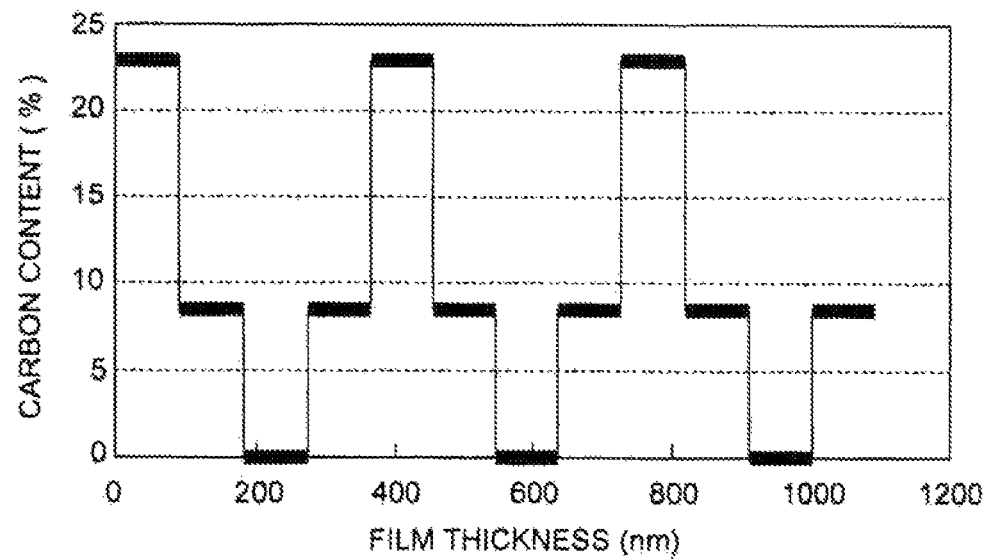

The results of the carbon content profile that is measured using the ESCALAB-200R manufactured by VG Scientific Corporation as the XPS surface analyzer are shown in FIG. 7b.

[Evaluation of Stability]

(Adhesion Evaluation)

Evaluation of adhesion for the transparent gas barrier film 1 formed above was performed using a JIS K 5400 compliant cross-cut adhesion test, and favorable results were obtained.

(Evaluation of Shelf Life)

Evaluation of adhesion for the transparent gas barrier film 1 formed above was performed using a JIS K 5400 compliant cross-cut adhesion test after immersion in 98° C. hot water for 48 hours and there was no deterioration in adhesion properties and favorable results were obtained.

(Evaluation of Ultraviolet Light Resistance)

Evaluation of adhesion for the transparent gas barrier film 1 formed above was performed using a JIS K 5400 compliant cross-cut adhesion test after irradiation with 1500 mW/cm$^2$ ultraviolet rays for 96 hours using a metal halide lamp and there was no deterioration in adhesion properties and extremely favorable results were obtained.

[Evaluation of Gas Barrier Properties]

[Measurement of Water Vapor Transmission Rate]

The water vapor transmission rate for the unprocessed transparent gas barrier film 1 and samples of the produced in "Shelf life" and "Ultraviolet light resistance" were measured using a JIS K 7129B stipulated method, and the water vapor transmission rate for all of the samples was 0.01 g/m$^2$/day or less.

(Measurement of Oxygen Transmission Rate)

The oxygen transmission rate for the unprocessed transparent gas barrier film 1 and samples of the produced in "Shelf life" and "Ultraviolet light resistance" were measured using a method stipulated by JIS K 7126B, and the oxygen transmission rate for all of the samples was 0.01 ml/m$^2$/day or less.

Example 2

Production of the Gas Barrier Film 2

A transparent gas barrier film 2 in which 3 units of a low density layer, an intermediate density layer, a high density layer, and an intermediate density layer with the profile constitution (pattern in which the layer density has an graded distribution) shown in FIG. 2 are formed on the substrate described in Example 1 using the same atmospheric plasma discharge treatment device as that used in Example 1. It is to be noted that in formation of the density gradation pattern, the second electrode (square pillar-shaped fixed electrode group) is inclined from the standard interval of 1 mm with respect to the first electrode (rotatable roll electrode) and the interval between the pair of second electrodes (square pillar-shaped fixed electrode group) is changed.

Of the twenty-four square pillar-shaped fixed electrodes, four from the upstream side are used for forming the first layer described below (low density layer 1), the next two are used for forming the second layer described below (intermediate density layer 1), the next two are used the next two are used for forming the fourth layer (intermediate density layer 3), the next two are used for forming the fifth layer (high density layer 1), the next two are used for forming the sixth layer (high density layer 2), the next two are used for forming the seventh layer (intermediate density layer 4), the next two are used for forming the eighth layer (intermediate density layer 5), the next two are used for forming the ninth layer (intermediate density layer 6), and the remaining four are used to form the tenth layer (low density layer 2), and the conditions are set so that the first layer to the tenth layer are laminated in one pass. The conditions are repeated twice to form the transparent gas barrier film 2.

(First Layer: Low Density Layer 1)

Plasma discharge was carried out under the conditions below to form a low density layer 1 having a thickness of approximately 90 nm.

<Gas Conditions>

| | |
|---|---|
| Discharge gas: Nitrogen gas | 94.8 volume % |
| Raw material gas: Hexamethyldisiloxane | 0.2 volume % |
| (abbreviated to HMDSO hereinafter) | |
| (Nitrogen gas is mixed and vaporized by a | |
| vaporizer manufactured by Lintec Commerce Inc.) | |
| Decomposition gas: Oxygen gas | 5.0 volume % |

<Power Condition: Only the Power Source at the First Electrode Side is Used>
First Electrode Side
Type of power source: High frequency power source manufactured by Applied Electronics Corporation
Frequency: 80 kHz
Output density: 10 W/cm$^2$
Electrode incline angle: −2°

The density of the first layer (low density layer 1) formed above was measured by the X-ray reflectance method using aforementioned MXP21 manufactured by Mac Science Co., Ltd. and the density changed from 1.90 to 1.99 at the graded structure.

(Second Layer: Intermediate Density Layer 1)

Plasma discharge was carried out under the conditions below to form an intermediate density layer 1 having a thickness of approximately 30 nm.

<Gas Conditions>

| | |
|---|---|
| Discharge gas: Nitrogen gas | 94.85 volume % |
| Raw material gas: Hexamethyldisiloxane | 0.15 volume % |
| (abbreviated to HMDSO hereinafter) | |
| (Nitrogen gas is mixed and vaporized by a | |
| vaporizer manufactured by Lintec Commerce Inc.) | |
| Decomposition gas: Oxygen gas | 5.0 volume % |

<Power Conditions: Only the Power Source for the First Electrode Side is Used>
First Electrode Side
Type of power source: High frequency power source manufactured by OYO Electronic Co., Ltd.
Frequency: 80 kHz
Output density: 10 W/cm$^2$
Electrode incline angle: −2°

The density of the second layer (intermediate density layer 1) formed above was measured by the X-ray reflectance method using aforementioned MXP21 manufactured by Mac Science Co., Ltd. and the density changed from 1.99 to 2.05 at the graded structure.

(Third Layer: Intermediate Density Layer 2)

Plasma discharge was carried out under the conditions below to form an intermediate density layer 2 having a thickness of approximately 30 nm.

<Gas Conditions>

| | |
|---|---|
| Discharge gas: Nitrogen gas | 94.85 volume % |
| Raw material gas: Hexamethyldisiloxane | 0.15 volume % |
| (abbreviated to HMDSO hereinafter) | |
| (Nitrogen gas is mixed and vaporized by a | |
| vaporizer manufactured by Lintec Commerce Inc.) | |
| Decomposition gas: Oxygen gas | 5.0 volume % |

<Power Conditions>
First Electrode Side
Type of power source: High frequency power source manufactured by OYO Electronic Co., Ltd.
Frequency: 80 kHz
Output density: 10 W/cm$^2$
Second Electrode Side
Type of power source: High frequency power source manufactured by Pearl Kogyo Co., Ltd
Frequency: 13.56 MHz
Output density: 5 W/cm$^2$
Electrode incline angle: −2°

The density of the third layer (intermediate density layer 2) formed above was measured by the X-ray reflectance method using aforementioned MXP21 manufactured by Mac Science Co., Ltd. and the density changed from 2.05 to 2.10 at the graded structure.

(Fourth Layer: Intermediate Density Layer 3)

Plasma discharge was carried out under the conditions below to form an intermediate density layer 3 having a thickness of approximately 30 nm.

<Gas Conditions>

| | |
|---|---|
| Discharge gas: Nitrogen gas | 94.9 volume % |
| Raw material gas: Hexamethyldisiloxane | 0.1 volume % |
| (abbreviated to HMDSO hereinafter) | |
| (Nitrogen gas is mixed and vaporized by a | |
| vaporizer manufactured by Lintec Commerce Inc.) | |
| Decomposition gas: Oxygen gas | 5.0 volume % |

<Power Conditions>
  First Electrode Side
    Type of power source: High frequency power source manufactured by OYO Electronic Co., Ltd.
    Frequency: 80 kHz
    Output density: 10 W/cm$^2$
  Second Electrode Side
    Type of power source: High frequency power source manufactured by Pearl Kogyo Co., Ltd
    Frequency: 13.56 MHz
    Output density: 5 W/cm$^2$
    Electrode incline angle: −2°

The density of the fourth layer (intermediate density layer 3) formed above was measured by the X-ray reflectance method using aforementioned MXP21 manufactured by Mac Science Co., Ltd. and the density changed from 2.10 to 2.16 at the graded structure.

(Fifth Layer: High Density Layer 1)

Plasma discharge was carried out under the conditions below to form a high density layer 1 having a thickness of approximately 45 nm.

<Gas Conditions>

| | |
|---|---|
| Discharge gas: Nitrogen gas | 94.85 volume % |
| Raw material gas: Hexamethyldisiloxane | 0.15 volume % |
| (abbreviated to HMDSO hereinafter) | |
| (Nitrogen gas is mixed and vaporized by a | |
| vaporizer manufactured by Lintec Commerce Inc.) | |
| Decomposition gas: Oxygen gas | 5.0 volume % |

<Power Conditions>
  First Electrode Side
    Type of power source: High frequency power source manufactured by OYO Electronic Co., Ltd.
    Frequency: 80 kHz
    Output density: 10 W/cm$^2$
  Second Electrode Side
    Type of power source: High frequency power source manufactured by Pearl Kogyo Co., Ltd
    Frequency: 13.56 MHz
    Output density: 10 W/cm$^2$
    Electrode incline angle: −2°

The density of the fifth layer (high density layer 1) formed above was measured by the X-ray reflectance method using aforementioned MXP21 manufactured by Mac Science Co., Ltd. and the density changed from 2.16 to 2.20 at the graded structure.

(Sixth Layer: High Density Layer 2)

Plasma discharge was carried out under the conditions below to form a high density layer 2 having a thickness of approximately 45 nm.

<Gas Conditions>

| | |
|---|---|
| Discharge gas: Nitrogen gas | 94.85 volume % |
| Raw material gas: Hexamethyldisiloxane | 0.15 volume % |
| (abbreviated to HMDSO hereinafter) | |
| (Nitrogen gas is mixed and vaporized by a | |
| vaporizer manufactured by Lintec Commerce Inc.) | |
| Decomposition gas: Oxygen gas | 5.0 volume % |

<Power Conditions>
  First Electrode Side
    Type of power source: High frequency power source manufactured by OYO Electronic Co., Ltd.
    Frequency: 80 kHz
    Output density: 10 W/cm.sup.2
  Second Electrode Side
    Type of power source: High frequency power source manufactured by Pearl Kogyo Co., Ltd
    Frequency: 13.56 MHz
    Output density: 10 W/cm$^2$
    Electrode incline angle: +2°

The density of the sixth layer (high density layer 2) formed above was measured by the X-ray reflectance method using aforementioned MXP21 manufactured by Mac Science Co., Ltd. and the density changed from 2.20 to 2.16 at the graded structure.

(Seventh Layer: Intermediate Density Layer 4)

Plasma discharge was carried out under the conditions below to form an intermediate density layer 4 having a thickness of approximately 30 nm.

<Gas Conditions>

| | |
|---|---|
| Discharge gas: Nitrogen gas | 94.9 volume % |
| Raw material gas: Hexamethyldisiloxane | 0.1 volume % |
| (abbreviated to HMDSO hereinafter) | |
| (Nitrogen gas is mixed and vaporized by a | |
| vaporizer manufactured by Lintec Commerce Inc.) | |
| Decomposition gas: Oxygen gas | 5.0 volume % |

<Power Conditions>
  First Electrode Side
    Type of power source: High frequency power source manufactured by OYO Electronic Co., Ltd.
    Frequency: 80 kHz
    Output density: 10 W/cm$^2$
  Second Electrode Side
    Type of power source: High frequency power source manufactured by Pearl Kogyo Co., Ltd
    Frequency: 13.56 MHz
    Output density: 5 W/cm$^2$
    Electrode incline angle: +2°

The density of the seventh layer (intermediate density layer 4) formed above was measured by the X-ray reflectance method using aforementioned MXP21 manufactured by Mac Science Co., Ltd. and the density changed from 2.16 to 2.10 at the graded structure.

(Eight Layer: Intermediate Density Layer 5)

Plasma discharge was carried out under the conditions below to form an intermediate density layer 5 having a thickness of approximately 30 nm.

<Gas Conditions>

| | |
|---|---|
| Discharge gas: Nitrogen gas | 94.85 volume % |
| Raw material gas: Hexamethyldisiloxane | 0.15 volume % |
| (abbreviated to HMDSO hereinafter) | |
| (Nitrogen gas is mixed and vaporized by a | |
| vaporizer manufactured by Lintec Commerce Inc.) | |
| Decomposition gas: Oxygen gas | 5.0 volume % |

<Power Conditions>
  First Electrode Side
    Type of power source: High frequency power source manufactured by OYO Electronic Co., Ltd.
    Frequency: 80 kHz
    Output density: 10 W/cm$^2$
  Second Electrode Side
    Type of power source: High frequency power source manufactured by Pearl Kogyo Co., Ltd
    Frequency: 13.56 MHz
    Output density: 5 W/cm$^2$
    Electrode incline angle: +2°

The density of the eighth layer (intermediate density layer 5) formed above was measured by the X-ray reflectance method using aforementioned MXP21 manufactured by Mac Science Co., Ltd. and the density changed from 2.10 to 2.05 at the graded structure.

(Ninth Layer: Intermediate Density Layer 6)

Plasma discharge was carried out under the conditions below to form an intermediate density layer 6 having a thickness of approximately 30 nm.

| | |
|---|---|
| Discharge gas: Nitrogen gas | 94.85 volume % |
| Raw material gas: Hexamethyldisiloxane | 0.15 volume % |
| (abbreviated to HMDSO hereinafter) | |
| (Nitrogen gas is mixed and vaporized by a | |
| vaporizer manufactured by Lintec Commerce Inc.) | |
| Decomposition gas: Oxygen gas | 5.0 volume % |

<Power Conditions: Only Power Source at First Electrode Side is Used>

First Electrode Side

Type of power source: High frequency power source manufactured by OYO Electronic Co., Ltd.

Frequency: 80 kHz

Output density: 10 W/cm$^2$

Electrode incline angle: +2°

The density of the ninth layer (intermediate density layer 6) formed above was measured by the X-ray reflectance method using aforementioned MXP21 manufactured by Mac Science Co., Ltd. and the density changed from 2.05 to 1.99 at the graded structure.

(Tenth Layer: Low Density Layer 2)

Plasma discharge was carried out under the conditions below to form a low density layer 1 having a thickness of approximately 90 nm.

<Gas Conditions>

| | |
|---|---|
| Discharge gas: Nitrogen gas | 94.0 volume % |
| Raw material gas: Hexamethyldisiloxane | 1.0 volume % |
| (abbreviated to HMDSO hereinafter) | |
| (Nitrogen gas is mixed and vaporized by a | |
| vaporizer manufactured by Lintec Commerce Inc.) | |
| Decomposition gas: Oxygen gas | 5.0 volume % |

<Power Conditions: Only Power Source at First Electrode Side is Used>

First Electrode Side

Type of power source: High frequency power source manufactured by OYO Electronic Co., Ltd.

Frequency: 80 kHz

Output density: 10 W/cm$^2$

Electrode incline angle: +2°

The density of the tenth layer (low density layer 2) formed above was measured by the X-ray reflectance method using aforementioned MXP21 manufactured by Mac Science Co., Ltd. and the density changed from 1.99 to 1.90 at the graded structure.

(Formation of the Eleventh to Thirtieth Layer)

The formation of the first layer to the tenth layer (one unit) is repeated twice under the same conditions to form the transparent gas barrier film 2 which has an graded density structure.

<Evaluation of the Transparent Gas Barrier Film>

[Measurement of Density Distribution]

Figure 8A:
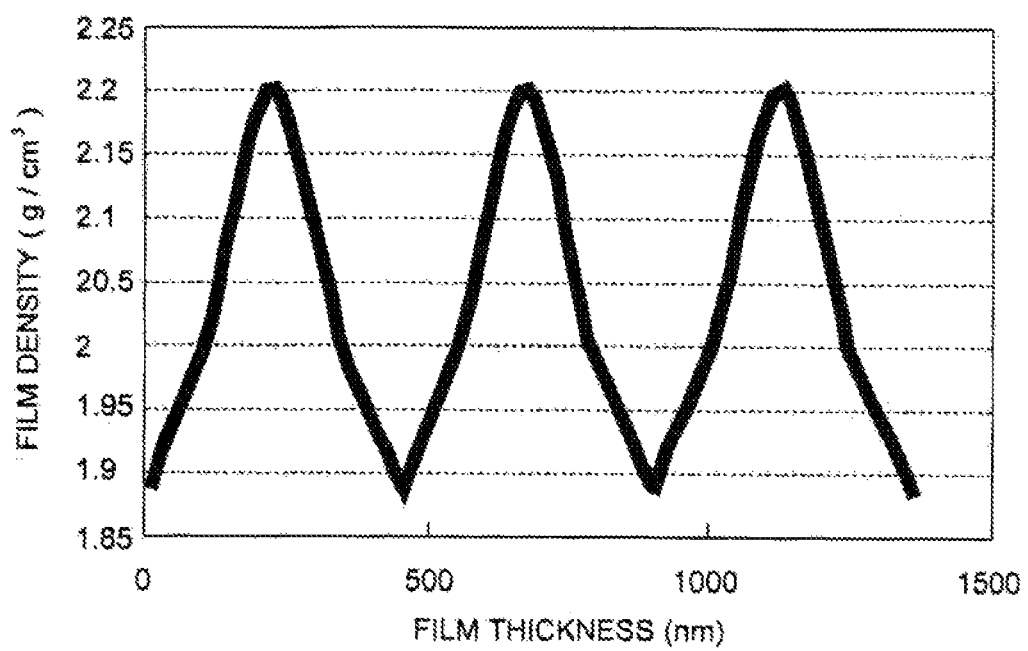
FIGS. 8a and 8b are illustrative graphs showing other results of the density profile measured by the X-ray reflectance method and the carbon content profile measured by the XPS surface analysis method.

The results of the density profile measured by the X-ray reflectance method using the MXP21 manufactured by Mac Science Co., Ltd. are shown in FIG. 8a.

[Measurement of Carbon Content]

Figure 8B:
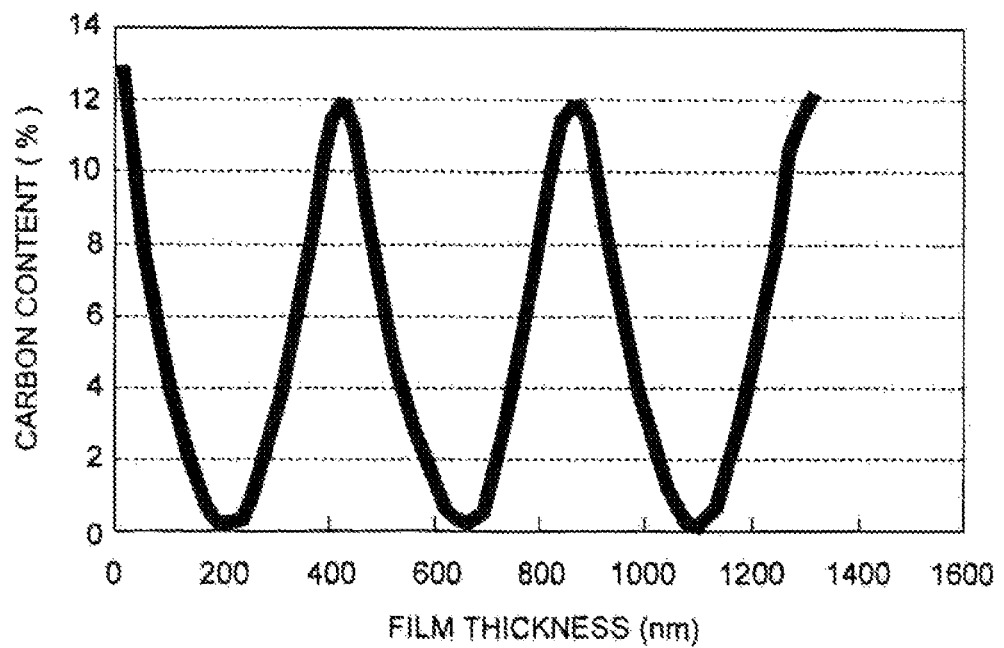

The results of the carbon content profile that is measured using the ESCALAB-200R manufactured by VG Scientific Corporation as the XPS surface analyzer are shown in FIG. 8b.

[Evaluation of Stability]

(Adhesion Evaluation)

Evaluation of adhesion for the transparent gas barrier film 2 formed above was performed using a JIS K 5400 compliant cross-cut adhesion test, and extremely favorable results were obtained.

(Evaluation of Shelf Life)

Evaluation of adhesion transparent gas barrier film 2 formed above was performed using a JIS K 5400 compliant cross-cut adhesion test after immersion 98° C. hot water for 48 hours and there was no deterioration in adhesion properties and extremely favorable results were obtained.

(Evaluation of Ultraviolet Light Resistance)

Evaluation of adhesion transparent gas barrier film 2 formed above was performed using a JIS K 5400 compliant cross-cut adhesion test after irradiation with 1500 mW/cm$^2$ ultraviolet rays for 96 hours using a metal halide lamp and there was no deterioration in adhesion properties and favorable results were obtained.

[Evaluation of Gas Barrier Properties]

[Measurement of Water Vapor Transmission Rate]

The water vapor transmission rate for the unprocessed transparent gas barrier film 2 and samples of the produced in "Shelf life" and "Ultraviolet light resistance" were measured using a JIS K 7129B compliant method, and the water vapor transmission rate for all of the samples was 0.01 g/m$^2$/day or less which represent extremely favorable results.

(Measurement of Oxygen Transmission Rate)

The oxygen transmission rate for the unprocessed transparent gas barrier film 2 and samples of the produced in "Shelf life" and "Ultraviolet light resistance" were measured using JIS K 7126B compliant method, and the vapor transmission rate for all of the samples was 0.01 ml/m$^2$/day or less which represent extremely favorable results.

Comparative Example 1

Preparation of the Transparent Gas Barrier Film 3

The transparent gas barrier film 3 is prepared in which six 45 nm gas barrier layers having a uniform density constitution is laminated in one pass on the substrate described in Example 1 using the same atmospheric plasma discharge treatment device as that used in Example 1 such that layer formation conditions at all the electrode portions are equal.

(Gas Barrier Layer)

Plasma discharge was carried out under the conditions below to form a gas barrier layer having a thickness of 270 nm.

<Gas Conditions>

| | |
|---|---|
| Discharge gas: Nitrogen gas | 94.9 volume % |
| Raw material gas: Hexamethyldisiloxane | 0.1 volume % |
| (abbreviated to HMDSO hereinafter) | |
| (Nitrogen gas is mixed and vaporized by a | |
| vaporizer manufactured by Lintec Commerce Inc.) | |
| Decomposition gas: Oxygen gas | 5.0 volume % |

<Power Conditions>First Electrode Side

Type of power source: High frequency power source manufactured by OYO Electronic Co., Ltd.

Frequency: 80 kHz
Output density: 10 W/cm²
Second Electrode Side
Type of power source: High frequency power source manufactured by Pearl Kogyo Co., Ltd
Frequency: 13.56 MHz
Output density: 10 W/cm²

The density of gas barrier layer formed above was measured by the X-ray reflectance method using aforementioned MXP21 manufactured by Mac Science Co., Ltd. and found to have an even composition density of 2.18
<Evaluation of the Transparent Gas Barrier Film>
[Evaluation of Stability]
(Adhesion Evaluation)

Evaluation of adhesion transparent gas barrier film 3 formed above was performed using a JIS K 5400 compliant cross-cut adhesion test, and cracks appeared over the entire surface and adhesion was absolutely unfavorable.
(Evaluation of Shelf Life)

Evaluation of adhesion transparent gas barrier film 3 formed above was performed using a JIS K 5400 compliant cross-cut adhesion test after immersion in 98° C. hot water for 48 hours and adhesion deteriorated further and product quality was extremely poor.
(Evaluation of Ultraviolet Light Resistance)

Evaluation of adhesion transparent gas barrier film 3 formed above was performed using a JIS K 5400 compliant cross-cut adhesion test after irradiation with 1500 mW/cm² ultraviolet rays for 96 hours using a metal halide lamp and adhesion deteriorated further and product quality was extremely poor.
[Evaluation of Gas Barrier Properties]
(Measurement of Water Vapor Transmission Rate)

The water vapor transmission rate for the unprocessed transparent gas barrier film 2 and samples of the produced in "Shelf life" and "Ultraviolet light resistance" were measured using a JIS K 7129B compliant method, and the water vapor transmission rate for the substrate by itself without the gas barrier layer was 6.0 g/m²/day or less, while each of the samples was approximately 5.0 g/m²/day indicating poor water vapor barrier properties.
(Measurement of Oxygen Transmission Rate)

The oxygen transmission rate for the unprocessed transparent gas barrier film 2 and samples of the produced in "Shelf life" and "Ultraviolet light resistance" were measured using a JIS K 7126B compliant method, and the oxygen transmission rate for the substrate by itself without the gas barrier layer was 20 ml/m²/day or less, while that of each of the samples was approximately 15 ml/m²/day indicating poor oxygen barrier properties.

Comparative Example 2

Preparation of the Transparent Gas Barrier Film 4

The transparent gas barrier film 4 is prepared in which four 1 µm gas barrier layers having a uniform density composition are laminated on the substrate described in Example 1 using the same atmospheric plasma discharge treatment device as that used in Example 1.
(First Layer: Gas Barrier Layer 1)

Plasma discharge was carried out under the conditions below to form a gas barrier layer 1 having a thickness of approximately 1 µm.

<Gas Conditions>

| | |
|---|---|
| Discharge gas: Nitrogen gas | 94.8 volume % |
| Raw material gas: Hexamethyldisiloxane (abbreviated to HMDSO hereinafter) (Nitrogen gas is mixed and vaporized by a vaporizer manufactured by Lintec Commerce Inc.) | 0.2 volume % |
| Decomposition gas: Oxygen gas | 5.0 volume % |

<Power Conditions>
First Electrode Side
Type of power source: High frequency power source manufactured by OYO Electronic Co., Ltd.
Frequency: 80 kHz
Output density: 10 W/cm²

The density of the first layer (gas barrier layer 1) formed above was measured by the X-ray reflectance method using aforementioned MXP21 manufactured by Mac Science Co., Ltd. and was found to have an even composition of 1.90.
(Formation of Second Layer to Fourth Layer)

The second to fourth layers were laminated under the same conditions as the first layer (gas barrier layer 1) to prepare a transparent gas barrier film 4 with a thickness of approximately 4 µm. The density of this transparent gas barrier film 4 was 1.9 over all the layers.
<Evaluation of the Transparent Gas Barrier Film>
[Evaluation of Stability]
(Adhesion Evaluation)

Evaluation of the adhesion transparent gas barrier film 4 formed above was performed using a JIS K 5400 compliant cross-cut adhesion test, and results were obtained that are in the permissible range for practical use.
(Evaluation of Shelf Life)

Evaluation of adhesion transparent gas barrier film 4 formed above was performed using a JIS K 5400 compliant cross-cut adhesion test after immersion in 98° C. hot water for 48 hours and there was no deterioration in adhesion and results were obtained that are in the permissible range for practical use.
(Evaluation of Ultraviolet Light Resistance)

Evaluation of adhesion transparent gas barrier film 4 formed above was performed using a JIS K 5400 compliant cross-cut adhesion test after irradiation with 1500 mW/cm² ultraviolet rays for 96 hours using a metal halide lamp and there was no deterioration in adhesion and results were obtained that are in the permissible range for practical use.
[Evaluation of Gas Barrier Properties]
(Measurement of Water Vapor Transmission Rate)

The water vapor transmission rate for the unprocessed transparent gas barrier film 4 and samples of the produced in "Shelf life" and "Ultraviolet light resistance" were measured using a JIS K 7129B compliant method, and no gas barrier properties were shown and the water vapor transmission rate for each of the samples was approximately 6.0 g/m²/day indicating extremely poor water vapor barrier properties.
(Measurement of Oxygen Transmission Rate)

The oxygen transmission rate for the unprocessed transparent gas barrier film 4 and samples produced in "Shelf life" and "Ultraviolet light resistance" were measured using a JIS K 7126B compliant method, and no gas barrier properties were shown and the oxygen transmission rate for each of the samples was approximately 20 ml/m²/day indicating poor oxygen transmission properties.

Comparative Example 3

Preparation of the Transparent Gas Barrier Film 5

The transparent gas barrier film 5 is prepared in which two layers each of a polymer layer (stress relief layer) having the composition described below and gas barrier layers are laminated on the substrate described in Example 1 using the same atmospheric plasma discharge treatment device as that used in Example 1.

(First Layer: Polymer Layer 1)

Plasma discharge was carried out under the conditions below to form a polymer layer 1 having a thickness of 100 nm.

<Gas Conditions>

| | |
|---|---|
| Discharge gas: Nitrogen gas | 99.5 volume % |
| Raw material gas: Polymer 1 | 0.5 volume % |
| (Nitrogen gas is mixed and vaporized by a vaporizer manufactured by Lintec Commerce Inc.) | |

* Polymer 1: tripropylene glycoldiacrylate (Aronics M-220 manufactured by Toagosei Co., Ltd.)

<Power Conditions>
First Electrode Side
Type of power source: High frequency power source manufactured by OYO Electronic Co., Ltd.
Frequency: 80 kHz
Output density: 20 W/cm$^2$ (Second Layer: Gas Barrier Layer 1)

Plasma discharge was carried out under the conditions below to form gas barrier layer 1 having a thickness of 100 nm.

<Gas Conditions>

| | |
|---|---|
| Discharge gas: Nitrogen gas | 94.9 volume % |
| Raw material gas: Hexamethyldisiloxane (abbreviated to HMDSO hereinafter) | 0.1 volume % |
| (Nitrogen gas is mixed and vaporized by a vaporizer manufactured by Lintec Commerce Inc.) | |
| Decomposition gas: Oxygen gas | 5.0 volume % |

<Power Conditions>
First Electrode Side
Type of power source: High frequency power source manufactured by OYO Electronic Co., Ltd.
Frequency: 80 kHz
Output density: 10 W/cm$^2$
Second Electrode Side
Type of power source: High frequency power source manufactured by Pearl Kogyo Co., Ltd
Frequency: 13.56 MHz
Output density: 10 W/cm$^2$ The density of the second layer (gas barrier layer 1) formed above was measured by the X-ray reflectance method using aforementioned MXP21 manufactured by Mac Science Co., Ltd. and an even composition of 2.18 was obtained.

(Formation of the Third Layer and the Fourth Layer)

A third layer (polymer layer 2) and a fourth layer (gas barrier layer 2) were further laminated using the same conditions as the first layer (polymer layer 1) and the second layer (gas barrier layer 1) to prepare the transparent gas barrier film 5 having a thickness of 400 nm.

<Evaluation of the Transparent Gas Barrier Film>
[Evaluation of Stability]
(Adhesion Evaluation)

Evaluation of the adhesion transparent gas barrier film 5 formed above was performed using a JIS K 5400 compliant cross-cut adhesion test, and favorable results were obtained.

(Evaluation of Shelf Life)

Evaluation of adhesion transparent gas barrier film 5 formed above was performed using a JIS K 5400 compliant cross-cut adhesion test after immersion in 98° C. hot water for 48 hours and deterioration in adhesion was confirmed.

(Evaluation of Ultraviolet Light Resistance)

Evaluation of adhesion transparent gas barrier film 5 formed above was performed using a JIS K 5400 compliant cross-cut adhesion test after irradiation with 1500 mW/cm$^2$ ultraviolet rays for 96 hours using a metal halide lamp and deterioration in adhesion was confirmed.

[Evaluation of Gas Barrier Properties]
(Measurement of Water Vapor Transmission Rate)

The water vapor transmission rate for the unprocessed transparent gas barrier film 5 measured using a JIS K 7129B compliant method was 0.01 g/m$^2$/day or less indicating favorable results, but for the samples produced in "Shelf life" and "Ultraviolet light resistance", water vapor barrier properties deteriorated and was 2.0-3.5 g/m$^2$/day for each sample.

(Measurement of Oxygen Transmission Rate)

The oxygen transmission rate for the unprocessed transparent gas barrier film 5 measured using a JIS K 7126B compliant method was 0.01 ml/m$^2$/day or less indicating favorable results, but for the samples produced in "Shelf life" and "Ultraviolet light resistance", oxygen barrier properties deteriorated and was 8.0-15 ml/m$^2$/day for each sample.

INDUSTRIAL APPLICABILITY

According to the present invention, a transparent gas barrier film can be provided which has excellent adhesion even when stored under severe conditions, and has favorable transparency and gas barrier resistance.

What is claimed is:

1. A method for manufacturing a transparent gas barrier film for an organic electroluminescence element comprising a substrate having thereon a gas barrier layer, wherein:
   the method comprises a step of forming the gas barrier layer on the substrate by a plasma CVD method using an organic silicon compound as a raw material gas and an oxygen gas as a decomposition gas,
   the gas barrier layer forming step is carried out under a condition so that a carbon content of the gas barrier layer in the thickness direction repeatedly changes more than two times from high value, via intermediate value, low value and intermediate value, to high value,
   the carbon content is defined by the formula: number of carbon atoms/total number of atoms×100, and
   a density of the gas barrier layer changes in the range of 1.90 g/cm$^3$ or more and 2.20 g/cm$^3$ or less in the thickness direction.

2. The method for manufacturing the transparent gas barrier film of claim 1, wherein the carbon content of the gas barrier layer in the thickness direction changes continuously.

3. The method for manufacturing the transparent gas barrier film of claim 1, wherein an oxygen transmission rate of the transparent gas barrier film is 0.01 g/m$^2$/day or less.

4. A method for manufacturing a transparent gas barrier film for an organic electroluminescence element comprising a substrate having thereon a gas barrier layer, wherein:
   the method comprises a step of forming the gas barrier layer on the substrate by a plasma CVD method using an organic silicon compound as a raw material gas and an oxygen gas as a decomposition gas,
   the gas barrier layer forming step is carried out under a condition so that a carbon content of the gas barrier layer in the thickness direction repeatedly changes more than two times from high value, via intermediate value, low value and intermediate value, to high value,
   the carbon content is defined by the formula: number of carbon atoms/total number of atoms×100, and a minimum carbon content of the gas barrier layer is 1.0% or less.

5. The method for manufacturing the transparent gas barrier film of claim 4, wherein the carbon content of the gas barrier layer in the thickness direction changes continuously.

6. The method for manufacturing the transparent gas barrier film of claim 4, wherein an oxygen transmission rate of the transparent gas barrier film is 0.01 g/m$^2$/day or less.

7. A method for manufacturing a transparent gas barrier film for an organic electroluminescence element comprising a substrate having thereon a gas barrier layer, wherein:
- the method comprises a step of forming the gas barrier layer on the substrate by a plasma CVD method using an organic silicon compound as a raw material gas and an oxygen gas as a decomposition gas,
- the gas barrier layer forming step is carried out under a condition so that a carbon content of the gas barrier layer in the thickness direction repeatedly changes more than two times from high value, via intermediate value, low value and intermediate value, to high value,
- the carbon content is defined by the formula: number of carbon atoms/total number of atoms×100, and
- a water vapor transmission rate of the transparent gas barrier film is 0.01 g/m$^2$/day or less.

8. The method for manufacturing the transparent gas barrier film of claim 7, wherein the carbon content of the gas barrier layer in the thickness direction changes continuously.

9. The method for manufacturing the transparent gas barrier film of claim 7, wherein an oxygen transmission rate of the transparent gas barrier film is 0.01 g/m$^2$/day or less.

* * * * *